(12) United States Patent
Hoefler et al.

(10) Patent No.: US 9,263,152 B1
(45) Date of Patent: Feb. 16, 2016

(54) ADDRESS FAULT DETECTION CIRCUIT

(71) Applicants: Alexander B. Hoefler, Austin, TX (US); Scott I. Remington, Austin, TX (US); Shayan Zhang, Cedar Park, TX (US)

(72) Inventors: Alexander B. Hoefler, Austin, TX (US); Scott I. Remington, Austin, TX (US); Shayan Zhang, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/339,049

(22) Filed: Jul. 23, 2014

(51) Int. Cl.
*G11C 7/00* (2006.01)
*G11C 29/02* (2006.01)
*G11C 11/418* (2006.01)
*G11C 11/408* (2006.01)
*G11C 29/00* (2006.01)

(52) U.S. Cl.
CPC ............. *G11C 29/02* (2013.01); *G11C 11/408* (2013.01); *G11C 11/418* (2013.01); *G11C 29/785* (2013.01); *G11C 11/4087* (2013.01); *G11C 29/808* (2013.01)

(58) Field of Classification Search
CPC ...... G11C 8/08; G11C 29/785; G11C 29/808; G11C 8/06; G11C 11/408; G11C 11/4087; G11C 2029/1202; G11C 29/846; G11C 2029/1802
USPC ................ 365/154, 230.03, 201, 200, 230.06
See application file for complete search history.

(56) References Cited

U.S. PATENT DOCUMENTS

| | | |
|---|---|---|
| 5,371,712 A | 12/1994 | Oguchi et al. |
| 7,679,185 B2 | 3/2010 | Zimmerman et al. |
| 8,379,468 B2 * | 2/2013 | Ramaraju et al. ............. 365/201 |
| 8,630,138 B2 * | 1/2014 | Kobayashi ..................... 365/201 |
| 8,687,444 B2 * | 4/2014 | Ide et al. ......................... 365/200 |
| 2009/0037782 A1 | 2/2009 | Hughes |

FOREIGN PATENT DOCUMENTS

EP 1049103 A1 11/2000

OTHER PUBLICATIONS

X. Yao et al, Single Event Transient Mitigation in Cache Memory using Transient Error Checking Circuits, IEEE Custom Integrated Circuits Conference (CICC), 2010 IEEE, Sep. 19-22, 2010.
S. Remington, U.S. Appl. No. 14/190,595, filed Feb. 26, 2014, entitled High-Speed Address Fault Detection Using Split Address ROM.

* cited by examiner

*Primary Examiner* — David Lam
(74) *Attorney, Agent, or Firm* — Terrile, Cannatti, Chambers & Holland, LLP; Michael Rocco Cannatti

(57) ABSTRACT

A semiconductor memory device and method of operation are provided for a multi-bank memory array (100) with an address fault detector circuit (24, 28) connected to split word lines (WLn-WLm) across multiple banks, where the address fault detector circuit includes at least a first MOSFET transistor (51-54) connected to each word line for detecting an error-free operation mode and a plurality of different transient address faults including a "no word line select," "false word line select," and "multiple word line select" failure mode at one of the first and second memory banks. In selected embodiments, the address fault detector provides resistive coupling (33-40) between split word lines across multiple banks to create interaction or contention between split word lines to create a unique voltage level on a fault detection bit line during an address fault depending on the fault type.

21 Claims, 6 Drawing Sheets

| TRIGGER $V_{HI}$ | TRIGGER $V_{LO}$ | RESULT | WORDLINE FAULT |
|---|---|---|---|
| YES | YES | FALSE/NO WORDLINE SELECT ERROR | YES |
| NO | NO | MULTI-WORDLINE SELECT ERROR | YES |
| NO | YES | ONE WORDLINE ON | NO |

ADDRESS FAULT DETECTION CIRCUIT

BACKGROUND OF THE INVENTION

1. Field of the Invention

The present invention is directed in general to word line faults in memories. In one aspect, the present invention relates to address fault detection for integrated circuit memories and associated methods of operation.

2. Description of the Related Art

Integrated circuit memories may fail in a variety of ways, and memory failures can have bigger impact as memories are increasingly used in various computer systems and applications. There are a variety of different ways for a memory to fail, including address decoder faults, word line faults, pre-decoder faults, address latch faults. In the class of memory failures relating to operation of the word lines, one type of fault (called a "no word line select" fault) occurs when no word line is enabled when the memory is intended to be accessed. Detection for this type of failure is commonly indicated by a signal called "word line on indicator" which indicates whether a word line has been enabled, i.e., a word line is on. Another type of fault (called a "multiple word line select" fault) occurs when more than one word line is enabled in the same array. Yet another type of fault (called a "false word line select" fault) occurs when a word line in an array is incorrectly asserted while another word line is incorrectly deasserted. Depending on the cause, such faults can be transient or non-transient in nature. For example, transient address faults can be caused by a particle strike in an address decoder, while non-transient address faults can be caused by a physical defect in the memory hardware. Although it is preferable that such errors do not occur, it is often the case that the integrated circuit can continue to function even with such errors, provided that a fault indication is quickly and efficiently provided so that the integrated circuit can make an appropriate correction. Existing memory systems have used address ROM banks with fault detection logic to provide a mechanism for detection of selected transient address faults during functional operation, such as by encoding the address ROM banks with hard encoded word line address information which is used to check if the correct word line is asserted. However, address ROM banks require significant chip area, especially when using a multi-bank array architecture with multiple different word lines since every bank needs a ROM bank.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A method and apparatus are described for quickly and efficiently detecting transient address faults in the address decoders of a multi-bank memory system that would cause "no word line select," "false word line select," and "multiple word line select" failure modes. In selected embodiments, high-speed address fault detection is provided by coupling word lines split across multiple banks with resistive elements or switched word line connection circuits so that the interaction or contention between split word lines during an address fault causes a unique voltage level at a fault detection bit line at each bank, depending on the fault type. In an example embodiment where corresponding word lines in adjacent banks are connected across a resistor or weak pass transistor(s), a word line address fault at one of the banks will cause the word line driver at that bank to go into contention, but due to the resistive coupling with corresponding word lines in other banks, the resistively coupled word lines will only partially assert. By connecting the fault detection bit line to the word lines in each bank as a single NOR-type ROM column configuration, a first high voltage trip point inverter connected to the fault detection bit line will detect that the partially asserted word line has failed to pull the fault bit line below the high voltage trip point, thereby driving the fault detection bit line to a first error condition state which is detected as a first fault (e.g., a "no word line select" fault or "false word line select" fault) by associated detection logic. In this configuration, if a word line address fault at a bank causes multiple word line drivers at that bank to go into contention, a second low voltage trip point inverter connected to the fault detection bit line will detect that the fault detection bit line is driven below a second low voltage trip point, thereby driving the fault detection bit line to a second error condition state which is detected as a second fault (e.g., a "multiple word line select" fault) by associated detection logic. Finally, if a single word line is correctly asserted without an address fault at the bank, the fault detection bit line is driven to a "no fault"

condition state which is between the low and high voltage trip points and which is detected by the plurality of voltage trip point inverters connected to the fault detection bit line using the associated detection logic. If desired the single ROM column may be connected to a sense amplifier with a plurality of trip points (e.g., multiple trip point inverters) to detect if error-free operation has occurred to otherwise detect specific transient address faults which drive the fault detection bit line to a specified voltage range for a "no word line select" error condition, a "false word line select" error condition, and a "multiple word line select" error condition.

Figure 1:
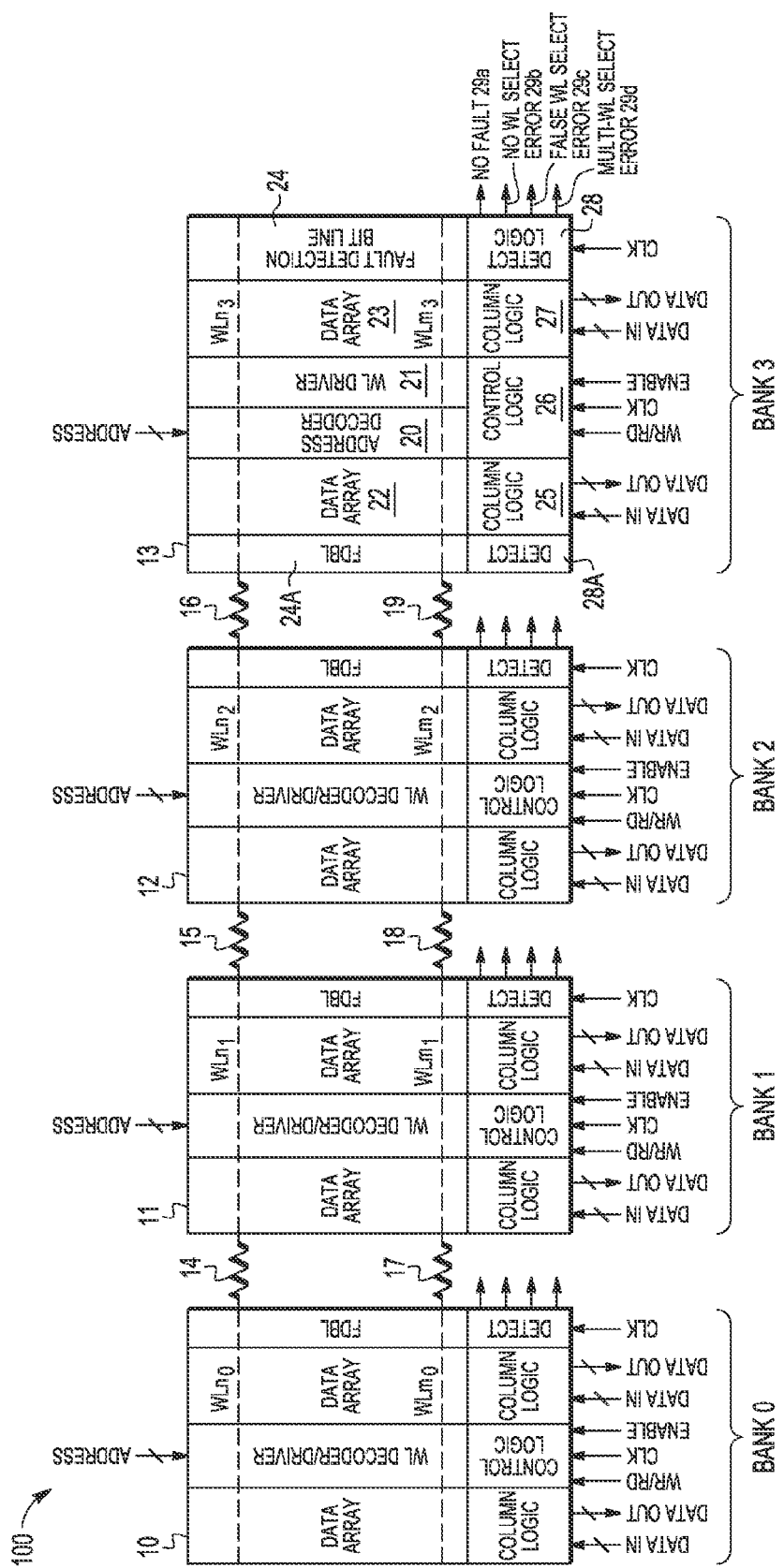
FIG. 1 is a schematic block diagram of a multi-bank, split array memory system with resistively coupled word lines and an address fault detection circuit in each bank that provides a "no fault" indicator along with a plurality of different word line fault indicators in accordance with selected embodiments of the present disclosure.

Shown in FIG. 1 is a schematic block diagram of a memory system 100 with a plurality of split array banks 10-13, each bank having resistively coupled word lines WLn, WLm and an address fault detection circuit (e.g., 28) that provides a "no fault" indicator 29a along with a plurality of different word line fault indicators 29b-d in accordance with selected embodiments of the present disclosure. The memory banks 10-13 each have the same design and structure, as exemplified with reference to Bank 3, and are connected together in series by coupling the word lines WLn, WLm across bank boundaries with resistive coupling elements 14-19 as shown. In particular, the word lines $WLn_0$, $WLm_0$ in Bank 0 are connected across a corresponding plurality of resistors 14, 17 to the word lines $WLn_1$, $WLm_1$ in Bank 1, which in turn are connected across a corresponding plurality of resistors 15, 18 to the word lines $WLn_2$, $WLm_2$ in Bank 2, which in turn are connected across a corresponding plurality of resistors 16, 19 to the word lines $WLn_3$, $WLm_3$ in Bank 3. As will be appreciated the resistive coupling elements 14-19 may be implemented with resistors, weak pass transistors, or any other coupling element that allows the assertion state of a word line in a first bank to influence the assertion state of a corresponding word line in an adjacent bank.

As depicted, each of the banks 10-13 (e.g., Bank 3) is implemented as a split array memory that is split into a data array 22 and data array 23. In selected embodiments, data array 22 holds the lower half of bits for data reads and/or writes to the memory system 100, and data array 23 holds the upper half of bits for data reads and/or writes to the memory system 100. To read and write data in the array 22, 23, each bank includes an address decoder 20 for receiving an address, a word line driver 21 coupled to address decoder 20, a control logic block 26 coupled to address decoder 20 and word line driver 21, and column logic blocks 25, 27 coupled to control logic 26. Each data array 22, 23 is coupled to word line driver 21, control logic 26, and column logic 25, 27. In addition, a fault detection bit line circuit 24 is selectively coupled to the word lines WLn, WLm and to a detection logic block 28 to provide the address fault detection circuit for generating a "no fault" indicator 29a along with a plurality of different word line fault indicators 29b-d. In selected embodiments, each array 22, 23 may have its own dedicated fault detection bit line circuit and detection logic, as indicated optionally with the detection logic block 28a and fault detection bit line circuit 24a which is selectively coupled to the word lines WLn, WLm in the data array 22 to provide the address fault detection circuit for the different word line fault indicators (not shown). Though the paired fault detection bit line circuits 24, 24a and detection logic blocks 28, 28a are shown only in Bank 3 13, it will be appreciated that the other banks may have the same matching configuration of fault detection bit line circuits and detection logic blocks. The control logic block 26 is connected to receive a write/read (WR/RD) signal, a clock CLK, and an enable signal. In addition, column logic blocks 25, 27 are connected receive address information for inputting input DATA IN and outputting DATA OUT to and from the split data array 22, 23. Each detection logic block 28 receives clock CLK and outputs a "no fault" indicator 29a, a "no word line select error" indictor 29b, a "false word line select error" indicator 29c, and a "multiple word line select error" indicator 29d.

In operation, the control logic block 26 receives the enable signal, prompting the address decoder 20 to respond to the address as timed by the clock CLK to select a word line in the split data array 22, 23. To this end, address decoder 20 processes the address to provide a decoded word line to the word line (WL) driver 21 which enables the selected word line. When a word line is enabled it is considered "ON." Based upon the decoded address, the word line driver 21 selects and drives a word line within the data array 22 and within the data array 23. As will be appreciated, multiple word line drivers could also be used. When the control signal WR/RD to the control logic block 26 specifies a write operation (WR), data in is written into memory cells along the selected word line by column logic 25, 27. However, when the control signal WR/RD to the control logic block 26 specifies a read operation, the column logic block 25, 27 outputs data out from the memory cells along the enabled word line. In selected embodiments, the column logic 25 receives data in for the lower half bits during writes and provides data out for the lower half bits during reads, and the column logic 27 receives data in for the upper half bits during writes and provides data out for the upper half bits during reads. The upper and lower bits are combined to form the data words being read from or written to the memory system 100. As described hereinbelow, the fault detection bit line circuit 24 may be selectively coupled with a single ROM column or other switching circuit connection configuration to the word lines (e.g., $WLn_3$-$WLm_3$) of the split data array 22, 23 to detect the presence or absence of transient fault or error conditions on the word lines in a particular way, and couple that information to detection logic 28 which interprets the information to provide the output fault indicators 29a-d. Though shown as being located at a peripheral edge of each memory bank, it will be appreciated that the fault detection bit line circuit 24 may be located adjacent to the address decoder 20 and WL driver 21 or inside of the split data array 22, 23, depending on the design requirements of the memory system 100.

In contrast to conventional memory systems fault detection schemes which use large address ROM arrays in each bank that consume significant chip area, the depicted fault detection bit line circuit 24 and associated detection logic 28 provide an area-efficient transient address fault detector which quickly detects word line faults using fewer detection bit lines than with conventional ROM array solutions. In selected embodiments, the smaller profile address fault detector uses one or two fault detection bit lines in each bank which are selectively coupled to all word lines WLn-WLm in the bank. In turn, the word lines of each bank (e.g., $WLn_2$-$WLm_2$) are coupled to corresponding word lines in other banks (e.g., $WLn_3$-$WLm_3$) with resistive elements (e.g., 16, 19) or switched word line connection circuits so that the interaction or contention between split word lines during a transient address fault causes a unique voltage level at the fault detection bit line circuit 24 at each bank, depending on the fault type.

Figure 2:
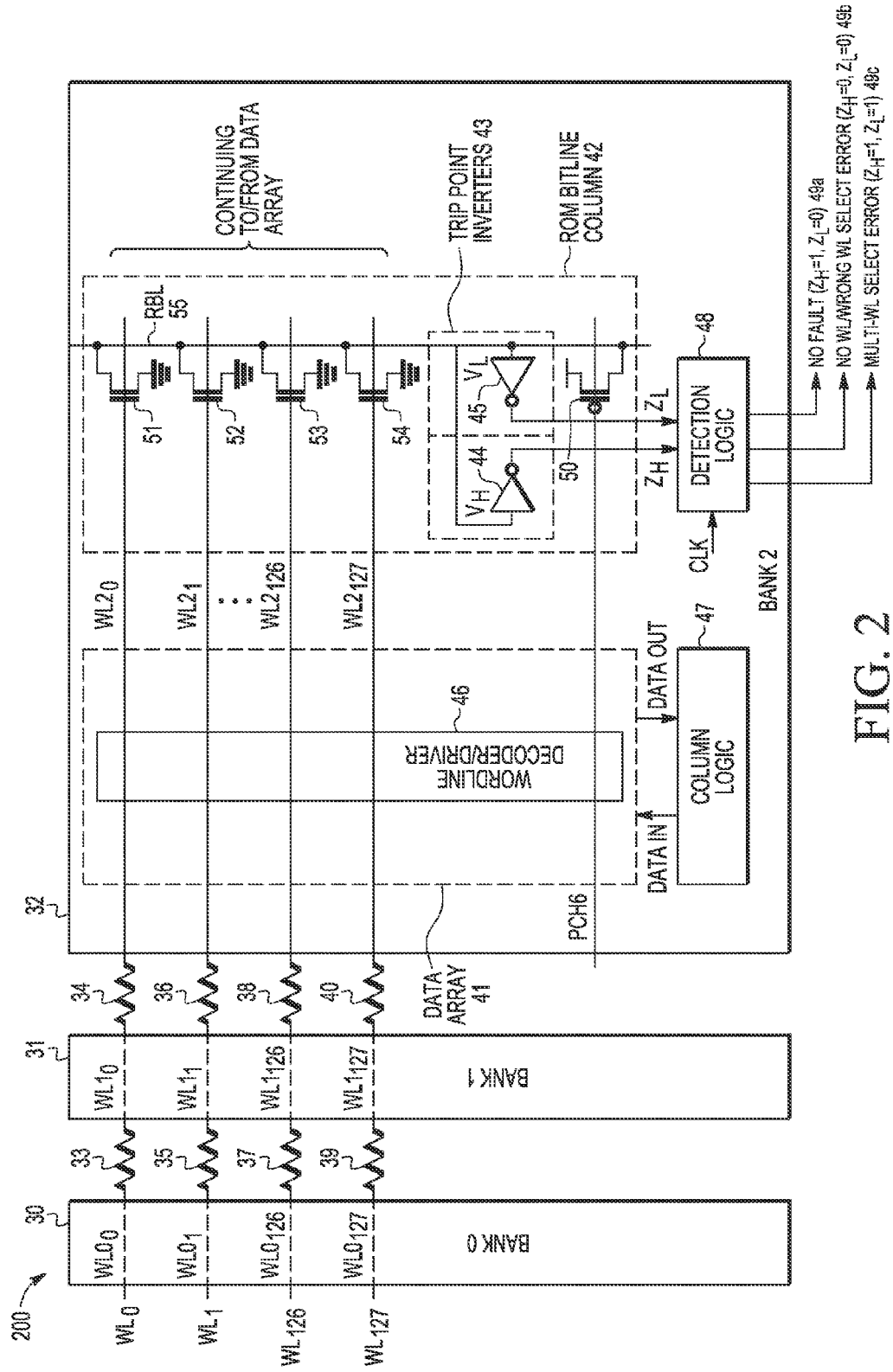
FIG. 2 is a schematic block diagram of a multi-bank memory system where the address fault detection circuit in each bank includes a single ROM column connected to a plurality of trip point inverters and associated detection logic for generating a "no fault" indicator along with a plurality of different word line fault indicators in accordance with selected embodiments of the present disclosure.

To illustrate selected embodiments of the fault detection bit line circuit described herein, reference is now made to FIG. 2 which shows a schematic block diagram of a multi-bank memory system 200 with a plurality of memory banks 30-32 which each have the same design and structure (as exemplified with reference to Bank 2) and which are connected together in series by coupling the word lines $WL_0$-$WL_{127}$ across bank boundaries with resistive coupling elements 33-40 as shown. In particular, the word lines $WL0_0$-$WL0_{127}$ in Bank 0 are connected across a corresponding plurality of resistors 33, 35, 37, 39 to the word lines $WL1_0$-$WL1_{127}$ in Bank 1, which in turn are connected across a corresponding plurality of resistors 34, 36, 38, 40 to the word lines $WL2_0$-$WL2_{127}$ in Bank 2. Each bank (e.g., 32) includes a data array 41 which is accessed by the word line decoder and driver circuit 46 and associated column logic 47 to input and output data according to a specified address input (not shown) as will be understood by those skilled in the art. In normal operation, control logic (not shown) at the word line decoder and driver circuit 46, upon receiving an enable signal, decodes the address to provide a decoded word line to the word line (WL) driver 46 which then selects a corresponding word line in data array 41. However, the operation of the word line decoder and driver circuit 46 can be disrupted by transient fault events, such as a particle strike to the decoder/driver 46, thereby generating transient address faults such as false word line assertions or deassertions.

To detect such transient address faults, each bank (e.g., 32) includes an address fault detection circuit implemented with a single ROM bit line column 42 having a plurality of transistors 51-54 connected across a fault detection ROM bit line 55 to a plurality of trip point inverters 44, 45. Depending on the outputs from the trip point inverters 44, 45, associated detection logic 48 responds to a clock input signal CLK to generate a "no fault" indicator 49a or one of a plurality of different word line fault indicators 49b-c. The actual signal received by detection logic 48 may be different from clock CLK but in such case would be derived from it. In the example shown, the single ROM column 42 has 128 word lines of which four are shown, $WL2_0$, $WL2_1$, $WL2_{126}$, and $WL2_{127}$. Crossing the word lines is a single fault detection bit line 55 also identified as a ROM bit line (RBL) which is connected to each word line across a corresponding N-channel transistor 51-54 functioning logically as a "NOR" type ROM in that any of the word lines being asserted (with a logical "1" input) results in the RBL 55 being driven toward a ground or reference voltage Vss (e.g., logical "0"). To this end, each of the N-channel transistors 51-54 has its gate connected to corresponding word line (e.g., $WL2_0$, $WL2_1$, $WL2_{126}$, and $WL2_{127}$), a source connected to ground, and a drain connected to the RBL 55. To precharge the RBL 55 for proper operation, a P-channel transistor 50 is also connected to charge RBL 55 in response to a precharge signal PCHB. Once precharged, the voltage level at the RBL 55 at a given memory bank (e.g., 32) is detected during a sense window by one or more trip point inverters 43 having inputs connected to RBL 55, where the voltage level at the RBL 55 will depend on the assertion states of the memory bank's word lines $WL2_0$-$WL2_{127}$, as well as their interaction with resistively coupled word lines (e.g., $WL1_0$-$WL1_{127}$) in the other memory banks (e.g., Bank 1).

For example, if a particle strike causes a false deassertion at a word line (e.g., $WL2_1$) in Bank 2 when there are no other word lines asserted in the bank, a first error condition state is created where none of the memory bank's word lines $WL2_0$-$WL2_{127}$ are asserted. In this case, none of the transistors 51-54 will be turned "ON" to connect the RBL 55 to ground. As a result, the RBL 55 will essentially remain in its precharged state or may be slightly discharged through one of the weakly activated transistors 51-54. The values and placement of the resistive coupling elements 33-40 are chosen to prevent any correctly asserted word lines (e.g., $WL_1$) in an adjacent memory bank (e.g., 31) from pulling the falsely deasserted word line (e.g., $WL2_1$) up sufficiently to turn "ON" its corresponding transistor (e.g., 52). In other words, the resistive element (e.g., 36) prevents any contention from a corresponding (correctly asserted) word line in another memory bank (e.g., $WL1_1$) from being sufficient to pull up the falsely deasserted word line (e.g., $WL2_1$). By the same token, the resistive elements (e.g., 35, 36) prevent the corresponding (correctly asserted) word lines (e.g., $WL0_1$, $WL1_1$) in the other memory banks 30, 31 from being pulled down into deassertion through contention with the falsely deasserted word line (e.g., $WL2_1$) in Bank 2. This "no word line select" fault condition may be detected by the first high voltage trip point inverter 44 which is connected to the RBL 55 to generate a first high trigger output value $Z_H=0$ when the voltage level at the RBL 55 is above the first high voltage trip point, and to generate a second high trigger output value $Z_H=1$ when the voltage level at the RBL 55 is below or not above the first high voltage trip point.

In similar fashion, the first high voltage trip point inverter 44 (or another high voltage trip point inverter set to a different trip point value) can be used to detect a second error condition state when one word line is falsely deasserted at the same time a second word line is falsely asserted, resulting in a "false word line select" fault condition. In this case, the falsely deasserted word line (e.g., $WL2_1$) pulls up slightly due to contention with the corresponding (correctly asserted) word lines (e.g., $WL0_1$, $WL1_1$) in the other banks 30, 31, but not enough to turn "ON" its corresponding transistor (e.g., 52) because of the resistive coupling elements 35, 36. By the same token, the falsely asserted word line (e.g., $WL2_{126}$) is pulled down due to contention with the corresponding (correctly deasserted) word lines (e.g., $WL0_{126}$, $WL1_{126}$) in the other banks 30, 31 to a voltage level that is not sufficient to turn "ON" its corresponding transistor (e.g., 53) because of the resistive coupling elements 37, 38. As a result, the first high voltage trip point inverter 44 responds to the voltage level at the RBL 55 to generate the first high trigger output value $Z_H=0$ when the voltage level at the RBL 55 is above the first high voltage trip point.

In addition, if two or more of the memory bank's word lines $WL2_0$-$WL2_{12}$ are asserted because of a correct assertion at a word line (e.g., $WL2_0$) in combination with a false assertion fault event at a word line (e.g., $WL2_1$), then a third error condition state is created where a plurality of transistors (e.g., 51, 52) corresponding to the asserted word lines (e.g., $WL2_0$ and $WL2_1$) will be turned "ON" to connect or pull the RBL 55 to ground. As a result, the RBL 55 will be substantially discharged through the activated plurality of transistors (e.g., 51, 52) which pulls the voltage level of the RBL 55 below a second low voltage trip point, notwithstanding the presence of resistive coupling elements 33-40. This "multiple word line select" fault condition may be detected by the second low voltage trip point inverter 45 which is connected to the RBL 55 to generate a first low trigger output value $Z_L=0$ when the voltage level at the RBL 55 is above the second low voltage trip point, and to generate a second low trigger output value $Z_L=1$ when the voltage level at the RBL 55 is not above the second low voltage trip point.

If there are no false assertions or deassertions in the memory system 200 so that only the correctly asserted word lines (e.g., $WL0_0$, $WL1_0$, $WL2_0$) in the memory banks 30-32 are asserted, then a "no fault" state is created where only the transistors (e.g., 51) corresponding to the correctly asserted word lines (e.g., $WL2_0$) will be turned on to connect or pull the RBL 55 to ground. Due to the presence of the resistive coupling elements 33, 34 connecting the other correctly asserted word lines (e.g., $WL0_0$, $WL1_0$) in the other memory banks, the RBL 55 will be partially discharged through the activated transistors (e.g., 51) to pull the voltage level of the RBL 55 between the first high voltage trip point and the second low voltage trip point. In this range, a "no fault" condition may be detected by the first high voltage trip point inverter 44 which generates a first high trigger output value $Z_H=1$ and by the second low voltage trip point inverter 45 which generates a second low trigger output value $Z_L=0$.

Based on the generated high and low trigger output values $Z_H$ and $Z_L$, the detection logic 48 may be configured to generate a "no fault" indicator 49a when the "no fault" state is detected (e.g., $Z_H=1$ and $Z_L=0$). In addition, the detection logic 48 may be configured to generate a "no word line select error" indicator or "wrong word line select error" indicator 49b when a "false word line select" state is detected (e.g., Z=0 and $Z_L=$). Finally, the detection logic 48 may be configured to generate a "multiple word line select error" indicator 49c when the "multiple word line select" state is detected (e.g., $Z_H=1$ and $Z_L=1$). In other embodiments, the detection logic 48 may be configured to generate a single "fault" indicator covering any of the different word line fault indicators 49b-c. In such embodiments, a single output signal may convey the "no fault" indicator with a first logic value, and may convey the "fault" indicator covering any of the different word line fault indicators with a second logic value.

As described hereinabove, with the connection of resistor elements 33-40 to couple word lines $WL_0$-$WL_{127}$ across bank boundaries, word line address faults in a particular bank that cause the word line drivers to falsely go into contention will result in only a partial assertion of the affected word line. Such word line address faults can be quickly and efficiently detected using a single ROM column bit line and sense amp with two or more trip points—one trip point at a high voltage and one at low voltage. If the ROM column bit line discharges past the high trip point but not past the low trip point, an error-free operation has occurred. This is illustrated with discharge curve 63 shown in FIG. 3 which depicts a simplified illustration of different discharge voltage plots 61-64 for the ROM column bit line versus time to illustrate the operational principle of the address fault detection in accordance with selected embodiments of the present disclosure. In particular, discharge curve 63 represents the voltage level at the ROM column bit line over time in the case where there are no address faults at the subject memory bank, in which case the ROM column bit line is connected to ground across a single activated transistor. Within a defined sense window 65 after the start time ($t_{start}$) when the word line enable signal is supplied to the memory bank, the ROM column bit line voltage is between the high trigger value Vhi and the low trigger value Vlo, indicating that the word lines in the memory bank are operating as expected and without fault. In selected embodiments, the sense window 65 may be positioned around a central sensing time ($t_{SENSE}$) with a start time ($t_{START}$) and end time ($t_{END}$) defining the duration of the sense time window (e.g., approximately 30 ps) to detect whether the voltage level at the ROM column bit line is within a specified voltage range (e.g., approximately 100 mV) between the high and low trigger values Vhi, Vlo.

Figures 3, 4:
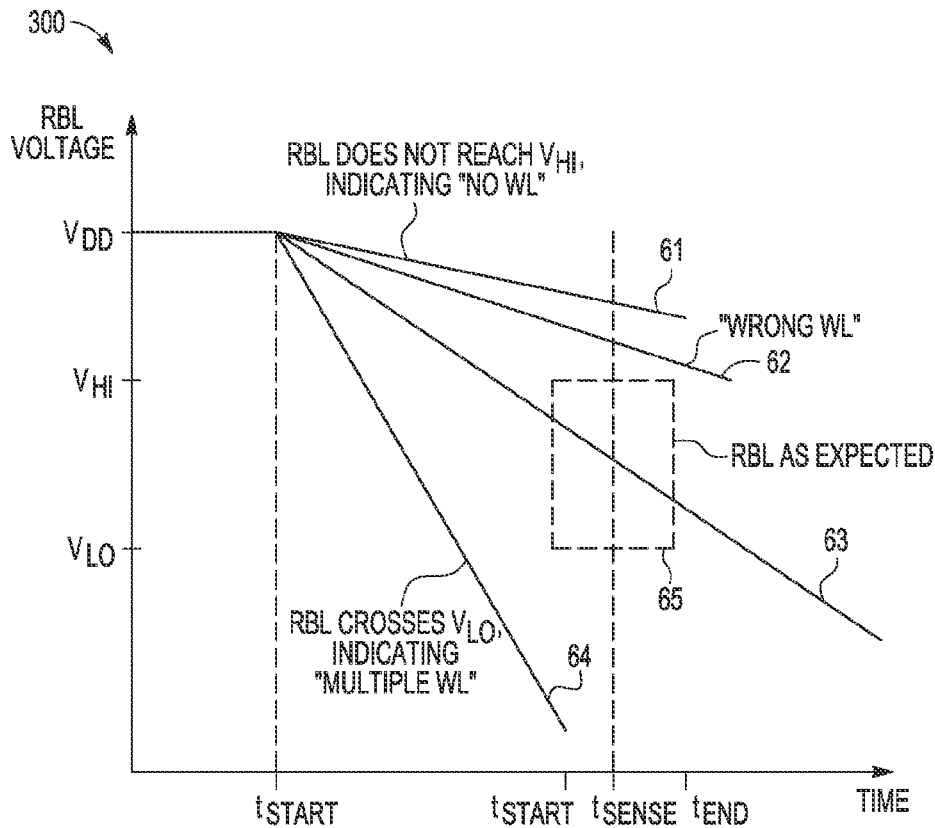
FIG. 3 is a simplified illustration of different discharge voltage plots for the ROM bit line column versus time to illustrate the operational principle of the address fault detection in accordance with selected embodiments of the present disclosure.
FIG. 4 is an operational table useful in understanding the operation of the word line fault detector in accordance with selected embodiments of the present disclosure.

On the other hand, if the ROM column bit line voltage does not fall within the defined sense window 65, an address fault is indicated. In one example, the discharge curve 61 shown in FIG. 3 depicts the voltage level at the ROM column bit line over time in the case where no word lines are selected at the subject memory bank, indicating a "no word line select" error. In this case, none of the word lines in the subject memory bank pull the ROM column bit line to ground, and any falsely deasserted word line which is connected across resistive elements to asserted word lines in other banks will only be pulled up slightly due to contention with the other word lines. As a result, the ROM column bit line voltage 61 does not discharge past the high trigger value Vhi during the sense window 65, indicating a "no word line select" fault condition.

In another example, the discharge curve 62 shown in FIG. 3 depicts the voltage level at the ROM column bit line over time in the case where a word line in the subject memory bank is falsely selected, indicating a "wrong word line select" error. This can occur when a first word line in the memory bank is falsely deasserted while simultaneously a second word line in the memory bank is falsely asserted. In this case, the resistive coupling of the falsely deasserted and falsely asserted word lines across bank boundaries results in none of the word lines in the subject memory bank being sufficiently asserted to pull the ROM column bit line to ground. As a result, the ROM column bit line voltage 62 does not discharge past the high trigger value Vhi during the sense window 65, indicating a "wrong word line select" fault condition. If desired, this fault condition could be detected by providing an additional trigger value or trip point between the high trigger value Vhi and the reference voltage level Vdd.

In yet another example, the discharge curve 64 shown in FIG. 3 depicts the voltage level at the ROM column bit line over time in the case where multiple word lines in the subject memory bank are selected, indicating a "multiple word line select" error. This can occur when a first word line in the memory bank is correctly asserted while simultaneously a second word line in the memory bank is falsely asserted. In this case, the resistive coupling of the falsely asserted word line across bank boundaries to correctly deasserted word lines allows the falsely asserted word line to be pulled up slightly. As a result, the falsely asserted word line helps the correctly asserted word line in the subject memory bank pull the ROM column bit line to ground. As a result, the ROM column bit line voltage 64 discharges past the low trigger value Vlo during the sense window 65, indicating a "multiple word line select" fault condition.

Another way of understanding the relationship between the different discharge voltage plots 61-64 shown in FIG. 3 is to characterize the voltage discharge behavior of ROM column bit line in relation to a plurality of different time constants. For example, if the ROM column bit line discharges from the reference voltage level Vdd to a ground or reference voltage Vss with a first time rate that greater than a first time constant (e.g., approximately 10 ps/mv to 1 ns/my), an address fault detector circuit connected to the voltage level on the ROM column bit line detects a "no word line select" or "false word line select" failure mode. However, if the ROM column bit line is discharged with a second time rate less than a second, different time constant (e.g., approximately 0.1 ps/mv to 1 ps/mv) that is smaller than the first time constant, the address fault detector circuit detects a "multiple word line select" failure mode. Finally, if the ROM column bit line is discharged with a third time rate between the first and second time constants, the address fault detector circuit detects the error-free operation mode at the first and second memory banks. In yet other embodiments, the voltage level of the ROM column bit line is discharged from the reference voltage level Vdd towards the ground or reference voltage Vss with a first time constant if the address fault detector circuit detects the error-free operation mode at the first and second memory banks, is discharged with a second time constant if the address fault detector circuit detects a "no word line select" or "false word line select" failure mode at one of the first and second memory banks, and is discharged with a third time constant if the address fault detector circuit detects a "multiple word line select" failure mode at one of the first and second memory banks, wherein the first time constant is less than the second time constant and greater than the third time constant. In operation, the address fault detector circuit may indicate the error-free operation mode at one of the first and second memory banks upon detecting that the voltage at the ROM column bit line discharges with a time rate faster than a first time constant and slower than a second time constant, where the first time constant is greater than the second time constant. Alternatively, the address fault detector circuit may indicate the "multiple word line select" failure mode at one of the first and second memory banks upon detecting that the voltage at the ROM column bit line discharges with a time rate faster than a first time constant and a second, smaller time constant. Finally, the address fault detector circuit may indicate the "no word line select" and "false word line select" failure modes at one of the first and second memory banks upon detecting that the voltage at the ROM column bit line discharges with a time rate slower than a first time constant.

The diagram of FIG. 4 shows that address fault detection bit line circuit 42 and detection logic 48 provide needed results for assisting in determining if a memory, such as data array 41, is functioning properly. The diagram shows at least two different conditions where there is a word line fault and one condition where there is no indication of a word line fault. In a first condition where the RBL voltage level has not discharged past the high trigger value $V_{HI}$ so that it meets or exceeds both the high trigger value ($V_{HI}$=YES) and the low trigger value ($V_{LO}$=YES) (e.g., $V_{RBL}$>$V_{HI}$>$V_{LO}$), the result indicated by the RBL voltage level is either a "no word line select error" or a "false word line select error," indicating that there is a word line fault. However, in a second condition where the RBL voltage level meets neither the low trigger value $V_{LO}$ or the high trigger value $V_{HI}$ (e.g., $V_{HI}$>$V_{LO}$>$V_{RBL}$), the result indicated by the discharged RBL voltage level is that a plurality of word lines in the bank have been selected, indicating that there is a "multiple word line select error" fault. Finally, a third condition occurs when the RBL voltage level meets the low trigger value $V_{LO}$ but not the high trigger value $V_{HI}$ (e.g., $V_{HI}$>$V_{RBL}$>$V_{LO}$), indicating that a single word line has been correctly asserted so that there is no word line fault indicated.

As described hereinabove, transient word line address faults may be detected by coupling word lines from different memory banks across resistive elements to achieve a unique set of split word line voltage levels which signify a plurality of different word line address fault conditions. With this resistive coupling connection between word lines, a word line address fault in first memory bank which causes the word line drivers to go into contention will only partially assert the associated word lines in the first memory bank, and can therefore be detected using a single ROM column and sense amp with two trip points, including a high voltage trip point and a low voltage trip point. If the ROM column is discharged to reach the high voltage trip point without reaching the low voltage trip point, an error-free operation has occurred. Otherwise, the discharge status of the ROM column provides an indication of a "no word line select" failure mode, a "false word line select" failure mode, or a "multiple word line select" failure mode. When implementing the ROM column cells and sense amp circuitry in each memory bank with devices of identical or substantially similar type, the performance of different banks can be easily matched to achieve tracking between different banks across operating conditions. In addition, the ROM column cell and sense amp circuitry can be readily upsized to achieve good matching between different banks. And by properly controlling and matching the performance of the ROM column cell and sense amp circuitry, the high and low voltage trip points in each memory bank may define a relatively narrow sense window (e.g., approximately 30 ps window) for detecting a normal operation range (e.g., approximately 100 mV) between Vhi and Vlo. In contrast to conventional multi-bank memory systems where the word lines are not connected together, the resistive coupling and contention between word lines in different banks enables the detection of false word line assertions that would otherwise be indistinguishable from correct word line operation with such conventional multi-bank memory systems. Likewise, multi-bank memory systems with the word lines shorted together cannot distinguish "multiple word line select" failures from correct operation since any false word line assertion in one bank would be too strongly coupled to ground by the corresponding word lines in the other banks. The ability to detect these address faults is based on the nature and frequency of the address faults being detected. For example, it may be assumed that only one word line decoder or memory bank has an address fault at any given time and that the other word line decoders are operating correctly due to the (low) likelihood of multiple transient address faults occurring together. This is a reasonable assumption since a particle strike cannot upset two different WL decoders at the same time. In addition, it may be assumed that different fault detection schemes are used to detect failures in the pre-decoder or address latch circuitry which can create a false assertion or deassertion events at multiple word lines in multiple banks.

Figure 5:
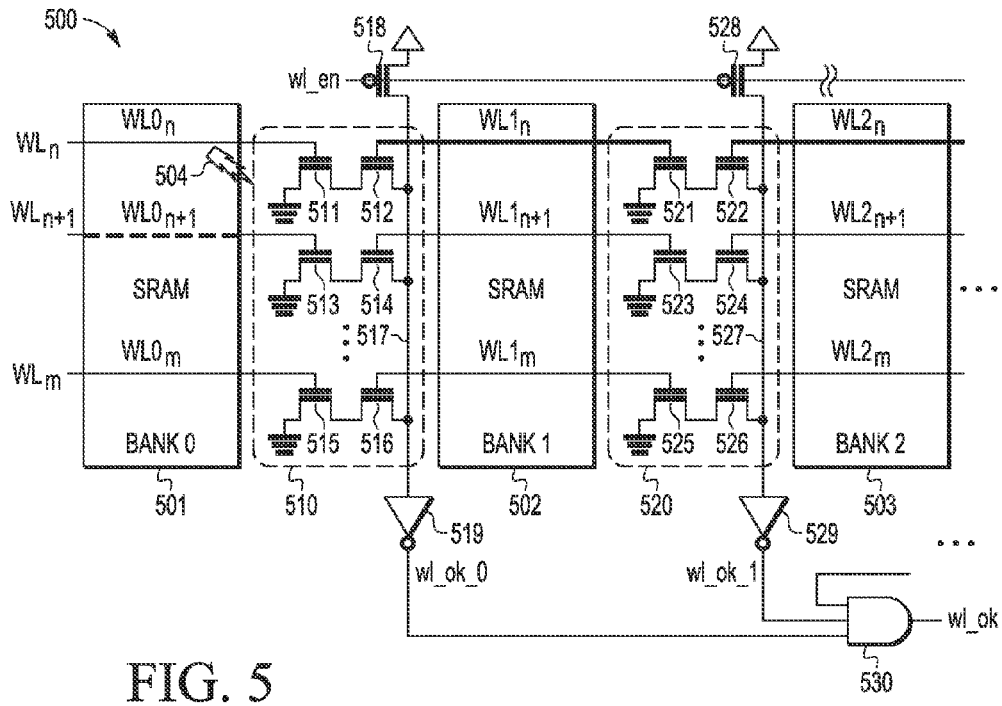
FIG. 5 shows a simplified block diagram of a multi-bank memory system in which a plurality of first switching circuits connect word lines of adjacent banks to detect different word line fault conditions in accordance with selected embodiments of the present disclosure.

To illustrate additional embodiments of the fault detection bit line circuit disclosed herein, reference is now made to FIG. 5 which shows a simplified schematic block diagram of a multi-bank memory system 500 with a plurality of memory banks 501-503 which each have the same design and structure, such as a data array that is accessed by word line decoder and driver circuitry along with control and column logic (not shown). In selected embodiments, each memory bank 501-503 is implemented with an SRAM array which includes a dedicated word line decoder and driver block controlled by corresponding address latches (not shown). Though not shown, the address latches for adjacent banks may be identical to one another and may each serve at least one memory bank, but may be separately controlled by different address codes or a shared address code to provide word line selection for the memory banks 501-503.

In the multi-bank memory system 500, corresponding word line segments (e.g., WL0n, WL1n, WL2n) in different banks (e.g., 501-503) are connected in series and asserted together in normal operation. However, instead of being shorted together or being disconnected from one another, corresponding word lines WLn-WLm in adjacent banks 501-503 are coupled together with a plurality of first switching circuits 510, 520 as shown to detect different word line fault conditions. In the first switching circuits 510, 520, corresponding word lines of adjacent memory banks are connected to control a pass gate circuit which connects a fault detection bit line to a reference voltage (e.g., ground) only when both of the corresponding word lines are asserted, thereby generating a "no fault" signal (e.g., wl_ok having a first or "HIGH" logic value) from the inverters 519, 529 at the outputs of the first switching circuits 510, 520. If "no fault" signals wl_ok_0, wl_ok_1 are generated from all of the memory banks, the resulting output (e.g., wl_ok="1") from the combinatorial logic circuit 530 (e.g., AND gate) indicates that there is no address fault detected. However, transient address faults can create conditions where there are no pairs of corresponding word lines in adjacent memory banks (e.g., Bank 0 501 and Bank 1 502) that are both asserted, such as occurs with a false word line deassertion or one or more false word line assertions. For example, a particle strike (e.g., 504) can falsely deassert a word line (e.g., as indicated with the thinner WL0n line and thicker WL1n line). In this case, none of the pass gate circuits in the first switching circuit (e.g., 510) will pull the fault detection bit line (e.g., 517) to the reference voltage (e.g., ground), thereby generating a "missing word line fault" signal (e.g., wl_ok having a second or "LOW" logic value). If a "missing word line fault" signal (e.g., wl_ok_0="0") is generated from any of the first switching circuits 510, 520, the resulting output (e.g., wl_ok="0") from the combinatorial AND logic circuit 530 indicates that there is an address fault detected.

In selected example embodiments, the first switching circuits 510, 520 may be implemented to connect word lines of adjacent memory banks (e.g., WL0n in Bank 0 and WL1n in Bank 1) to corresponding gates of a series-connected pair of transistors (e.g., NMOS transistors 511-512) which are coupled between a reference voltage (e.g., ground) and a fault detection bit line (e.g., 517). In addition, the remaining word lines of the memory banks (e.g., WL0n+1 through WL0m in Bank 0 and WL1n+1 through WL1m in Bank 1) are respectively connected to the gates of a series-connected transistor pairs 513-514, 515-516 which are each coupled between the reference voltage (e.g., ground) and fault detection bit line (e.g., 517) as shown. The same connection arrangement may be used to connect the word lines of additional adjacent memory banks (e.g., WL1n through WL1m in Bank 1 and WL2n through WL2m in Bank 2) to the gates of a series-connected transistor pairs 521-522, 523-524, 525-526 which are each coupled between the reference voltage (e.g., ground) and a corresponding fault detection bit line (e.g., 527) which in turn is connected between a word line enable transistor (e.g., PMOS transistor 528) and an inverter circuit (e.g., 529). With each fault detection bit line (e.g., 517) connected between a word line enable transistor (e.g., PMOS transistor 518) and an inverter circuit (e.g., 519), the word line enable transistor (e.g., 518) precharges or pulls "UP" the fault detection bit line (e.g., 517) to a reference voltage (e.g., Vdd) in response to a common word line enable (wl_en) signal for the multi-bank memory system 500 having a first or "LOW" logic level, but is otherwise turned "OFF" to float the fault detection bit line (e.g., 517) when the common word line enable (wl_en) signal has a second or "HIGH" logic level. In this configuration, address fault detection occurs when the common word line enable (wl_en) signal has the second or "HIGH" logic level by detecting the voltage level of the detection bit line (e.g., 517) at the output of the inverter (e.g., 519). In particular, since each series-connected transistor pair (e.g., 511-512) is connected to pull the corresponding fault detection bit line (e.g., 517) to the ground reference voltage only when both of the corresponding word lines (e.g., WL0n and WL1n) from adjacent memory banks (e.g., Bank 0 and Bank 1) are asserted together. However, if either of the corresponding word lines (e.g., WL0n and WLn) from adjacent memory banks (e.g., Bank 0 and Bank 1) are not asserted together, the series-connected transistor pair (e.g., 511-512) cannot pull the corresponding fault detection bit line (e.g., 517) to the ground reference voltage.

During normal, error-free operation when a single pair of corresponding word lines (e.g., WL1n and WL2n) in adjacent banks (e.g., Bank 1 502 and Bank 2 503) are correctly asserted (as indicated by the thicker lines WL1n, WL2n), the first switching circuit (e.g., 520) between the adjacent banks (e.g., 502, 503) will be activated by the correctly asserted word lines (e.g., WL1n and WL2n) to pull the fault detection bit line (e.g., 527) to ground reference voltage across the activated transistor pair (e.g., 521-522), thereby generating a "no fault" signal (e.g., wl_ok_1) at the output of inverter (e.g., 529) having a first or "HIGH" logic value for the adjacent banks. However, if there is a transient fault (e.g., a particle strike 504) which causes a word line (e.g., WL0n) in a first memory bank (e.g., Bank 0 501) to falsely deassert, this will be detected by the first switching circuit (e.g., 510) which is connected between the first memory bank (e.g., 501) and adjacent memory bank (e.g., 502). In particular, the correctly asserted corresponding word line (e.g., WL1n) in the adjacent bank (e.g., Bank 1 502) will activate one of the transistors (e.g., 512) in the corresponding transistor pair (e.g., 511-512), but the falsely deasserted word line (e.g., WL0n) in the first memory bank (e.g., Bank 0 501) will not activate the other transistor (e.g., 511), leaving the fault detection bit line (e.g., 517) at the precharged voltage level since it is not discharged or pulled to the ground reference voltage. As a result of a "HIGH" voltage level on the fault detection bit line (e.g., 517), the inverter circuit (e.g., 519) generates a "missing word line fault" signal (e.g., wl_ok_0="0") to indicate that there is an address fault detected. In addition, a "false word line select fault" signal can be generated if one or more of the word lines (e.g., WL0n+1 indicated with the thick dashed line) in a first memory bank (e.g., Bank 0 501) is falsely asserted while simultaneously another word line (e.g., WL0n) is falsely deasserted. In these cases, the correct assertion of the corresponding word line (e.g., WL1n) in an adjacent memory bank (e.g., Bank 1 502) is insufficient to cause the first switching circuit (e.g., 510) between adjacent banks (e.g., 501, 502) to pull the fault detection bit line (e.g., 517) to ground reference voltage across the activated transistor pair (e.g., 511-512) when the corresponding word line WL0n is falsely deasserted. Likewise, any falsely asserted word line(s) (e.g., WL0n+1) are likewise insufficient to cause the first switching circuit (e.g., 510) to pull the fault detection bit line (e.g., 517) to ground reference voltage. As a result, the first switching circuit (e.g., 510) generates a "fault" signal (e.g., wl_ok_0) at the output of inverter (e.g., 519) having a second or "LOW" logic value for the adjacent banks since none of the transistor pairs (e.g., 511-516) in the first switching circuit (e.g., 510) pulls or discharges the fault detection bit line (e.g., 517) to the ground reference voltage.

Figure 6:
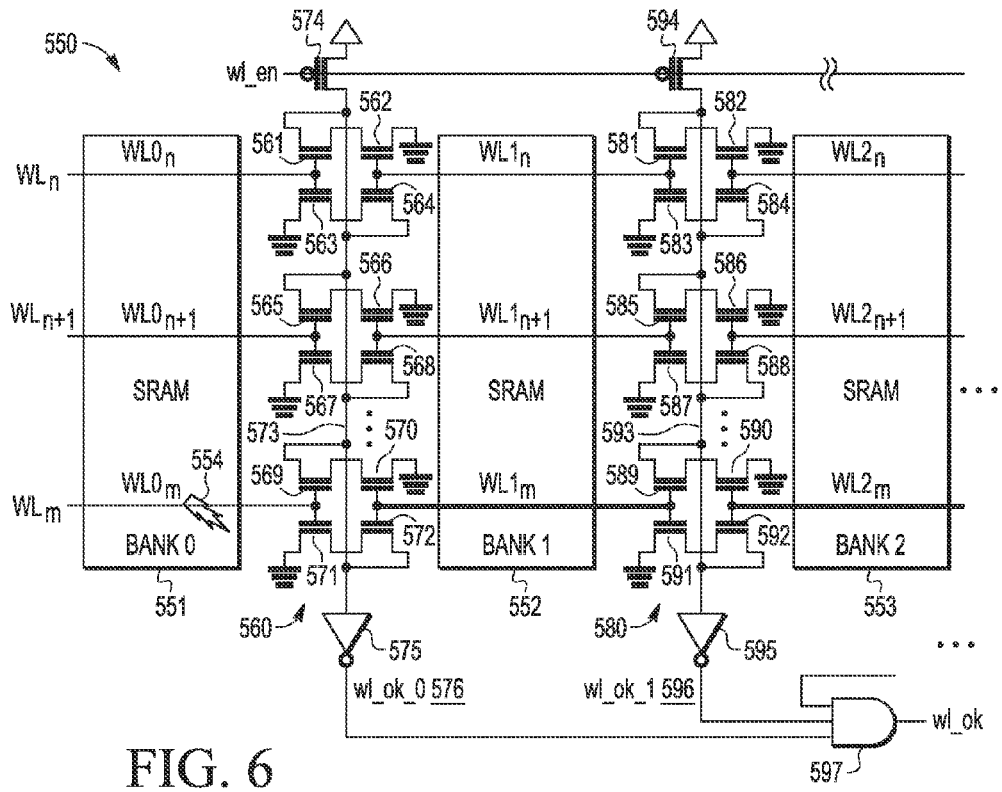
FIG. 6 shows a simplified block diagram of a multi-bank memory system in which a plurality of second switching circuits connect word lines of adjacent banks to detect different word line fault conditions in accordance with selected embodiments of the present disclosure.

To illustrate additional embodiments of the fault detection bit line circuit disclosed herein, reference is now made to FIG. 6 which shows a simplified schematic block diagram of a multi-bank memory system 550 with a plurality of memory banks 551-553 which each have the same design and structure (not shown). In the illustrated multi-bank memory system 550, corresponding word line segments (e.g., WL0n, WL1n, WL2n) in different banks (e.g., 551-553) belonging to the same address code are connected in series with a plurality of second switching circuits 560, 580 to detect different word line fault conditions. With each second switching circuit 560, 580 implementing a plurality of symmetric, multi-path pass gate circuits to connect a fault detection bit line to a reference voltage (e.g., ground) under control of the corresponding word lines, each second switching circuit 560, 580 is configured to generate a "no fault" signal only when both corresponding word lines in adjacent memory banks are asserted, but to otherwise generate an "address fault" signal when both corresponding word lines are not asserted.

In selected embodiments, the second switching circuits 560, 580 may be implemented to connect corresponding word lines of adjacent memory banks using one or more mirrored pass gate circuits to generate a "no fault" or "address fault" signal at a fault detection bit line, depending on the voltage levels at the corresponding word lines. For example, the corresponding word lines of adjacent memory banks (e.g., WL0n in Bank 0 and WL1n in Bank 1) are each connected to a different pair of gates in a mirrored pass gate circuit 561-564 which includes a first series-connected pair of transistors (e.g., NMOS transistors 561-562) sharing common gates with a second, mirrored series-connected pair of transistors (e.g., NMOS transistors 563-564) connected in parallel between the reference voltage (e.g., ground) and fault detection bit line (e.g., 573). Each series-connected pair of transistors one transistor gate connected to one of the word lines and the other transistor gate connected to the other word line. In addition, the remaining word lines of the memory banks (e.g., WL0n+1 through WL0m in Bank 0 and WL1n+1 through WL1m in Bank 1) are respectively connected to different gates of mirrored transistor pairs 565-568, 569-572 for selectively controlling the coupling of the fault detection bit line (e.g., 573) to the reference voltage (e.g., ground) as shown, and the same connection arrangement is used to connect the word lines of additional adjacent memory banks (e.g., WL1n through WL1m in Bank 1 and WL2n through WL2m in Bank 2) to different gates of mirrored transistor pairs 581-584, 585-588, 589-592 for selectively controlling the coupling of the fault detection bit line (e.g., 593) to the reference ground voltage. By connecting the corresponding word lines (e.g., WL1m, WL2m) of adjacent memory banks (e.g., 552, 553) to different gates of each series-connected pair of transistors in the mirrored pass gate circuit (e.g., 589-592), the error-free assertion of corresponding word lines (indicated with the thicker WL1m, WL2m lines) in the adjacent memory banks will activate the first and second mirrored series-connected pair of transistors (e.g., 589-592) more quickly and symmetrically discharge the fault detection bit line (e.g., 593) to the reference or ground voltage. In addition to providing additional discharge paths, the symmetrical arrangement of the first and second mirrored series-connected pair of transistors (e.g., 589-592) accounts for the memory banks (e.g., 552, 553) turning "ON" at different times by balancing the delay, regardless of which memory bank turns "ON" first. On the other hand, this arrangement prevents the fault detection bit line (e.g., 573) from discharging across a mirrored pass gate circuit (e.g., 561-564) if the gates of either or both the first or second mirrored series-connected pair of transistors are connected to a word line (e.g., WL0n) that is not asserted. With each fault detection bit line (e.g., 573, 593) connected between a word line enable transistor (e.g., PMOS transistor 574, 594) and an inverter circuit (e.g., 575, 595), the word line enable transistor (e.g., 574, 594) precharges or pulls "UP" the fault detection bit line (e.g., 573, 593) to a reference voltage (e.g., Vdd) when a common word line enable (wl_en) signal has a first or "LOW" logic level, but otherwise floats the fault detection bit line (e.g., 573, 593) when the common word line enable (wl_en) signal has a second or "HIGH" logic level.

In the configuration shown in FIG. 6, the second switching circuits 560, 580 are connected and controlled by corresponding word lines of adjacent memory banks such that each mirrored pass gate circuit (e.g., 561-564) connects a fault detection bit line (e.g., 573) across multiple NMOS transistor discharge paths to a reference ground voltage only when both of the corresponding word lines (e.g., WL0n, WL1n) are asserted, thereby generating a "no fault" signal 576 (e.g., wl_ok having a first or "HIGH" logic value) from the inverter circuit (e.g., 575). If "no fault" signals 576, 596 are generated at the outputs of inverters 575, 595 by the second switching circuits 560, 580, the resulting output (e.g., wl_ok="1") from the combinatorial logic circuit 597 (e.g., AND gate) indicates that there is no address fault detected. However, there can be address fault conditions where corresponding word lines in adjacent memory banks are not both asserted, such as occurs when a particle strike (e.g., 554) falsely deasserts a word line (e.g., indicated with the thinner WL0m line) in one of the memory banks (e.g., Bank 0 551) without affecting a correctly asserted word line (e.g., indicated with the thicker WLm line) in an adjacent memory bank (e.g., Bank 1 552). In this case, the corresponding mirrored pass gate circuit 569-572 in the second switching circuit 560 will not pull the fault detection bit line 573 to ground since the transistors 569, 571 are not activated by the deasserted word line WL0m. And since it is highly unlikely that one or more false word line assertions in the memory bank (e.g., Bank 0 551) would simultaneously occur with corresponding false word line assertions in the adjacent memory bank (e.g., Bank 1 552), the chances are very low or negligible that the other mirrored pass gate circuits 561-568 in the second switching circuit (e.g., 560) will pull the fault detection bit line (e.g., 573) to the ground reference voltage. In these cases where the fault detection bit line 573 in the second switching circuit 560 remains "HIGH" and is not discharged or pulled to ground, the inverter circuit (e.g., 575) generates an "address fault" signal 576 (e.g., wl_ok having a second or "LOW" logic value). If an "address fault" signal (e.g., wl_ok_0="0") is generated from any of the inverters 575, 595 by the second switching circuits 560, 580, the resulting output (e.g., wl_ok="0") from the combinatorial AND logic circuit 597 indicates that there is an address fault detected.

As described above, the switching circuits shown in FIGS. 5-6 are suitable for detecting a "missing word line" fault wherein a word line is falsely deasserted in a memory bank. As will be appreciated, the same switching circuits may detect one or more false word line assertions that simultaneously occur in the same memory bank where the false deassertion occurs. In the case of a false word line selection fault condition in the same memory bank (e.g., FIG. 5 shows WL0n+1 is falsely asserted when WL0n is falsely deasserted), there is such a low or negligible likelihood that corresponding word lines in the adjacent bank (e.g., WL1n+1) will also be falsely asserted that it can be safely assumed that a single falsely asserted word line WL0n+1 will not successfully trigger the associated switching circuit (e.g., 513-514) to connect the fault detection bit line (e.g., 517) to the reference voltage (e.g., ground) since only half of the pass gate circuit is activated in such a situation, and the resulting fault signal output (e.g., wl_ok_0) is indistinguishable from the "missing word line fault" signal. The same holds true for the case of multiple false word line selection faults (e.g., if WL0n and WL0n+1 in FIG. 6 are falsely asserted when WL0m is falsely deasserted) since the falsely asserted word lines WL0n, WL0n+1 do not cause the switching circuit 560 to connect the fault detection bit line 573 to the reference voltage (e.g., ground) across switching circuit 561-568 in the case where WL0n and WL0n+1 are both falsely asserted, and the resulting fault signal output (e.g., wl_ok_0) is indistinguishable from the "no fault" signal. While "missing word line" and "false word line" faults can be detected, the switching circuits in FIGS. 5-6 are not suitable for detecting "multiple word line selection" faults where one or more falsely asserted word lines in a memory bank are simultaneously asserted with a correctly asserted word line in the same memory bank.

Figure 7:
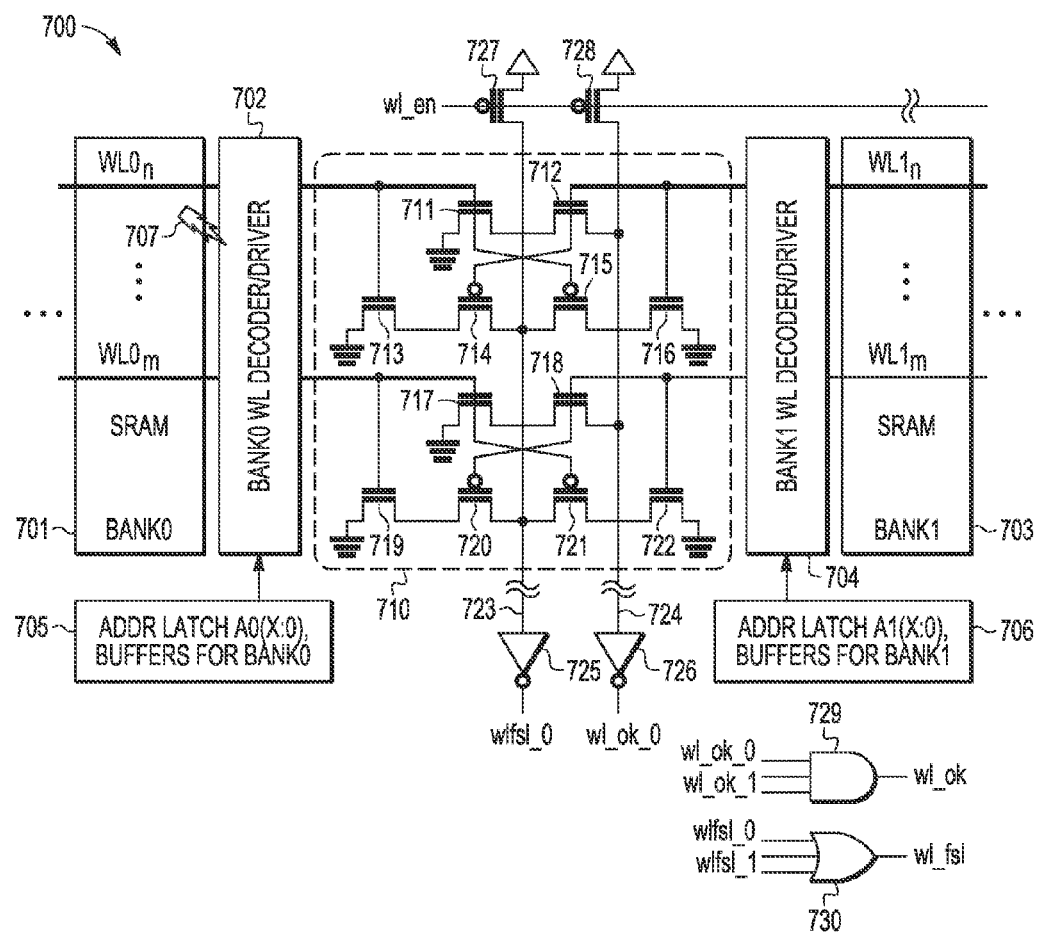
FIG. 7 shows simplified block diagrams of a multi-bank memory system having word line decoder and driver circuits in adjacent banks connected across a plurality of third switching circuits which connect word lines of adjacent banks to detect different word line fault conditions in accordance with selected embodiments of the present disclosure.

To illustrate additional embodiments of the fault detection bit line circuit disclosed herein for detecting multiple word line selection faults, reference is now made to FIG. 7 which shows a simplified schematic block diagram of a multi-bank memory system 700 with a plurality of memory banks 701, 703, each of which has the same SRAM design and structure with adjacent word line decoder and driver blocks 702, 704 controlled by corresponding address latches 705, 706. In this configuration, the address latches 705, 706 may be identical to one another and may each serve at least one memory bank, but may be separately controlled by different address codes to provide word line selection. In the illustrated multi-bank memory system 700, corresponding word line segments (e.g., WL0n, WL1n) in different banks (e.g., 701, 703) are connected in series with a third switching circuit 710 to detect different word line fault conditions. With each third switching circuit 710, a plurality of symmetric pass gate circuits are connected to each pair of word lines to control the connection of a first "no fault" detection bit line and a second "address fault" bit line to a reference voltage (e.g., ground), depending on the assertion status of the corresponding word lines. In the disclosed configuration of the third switching circuit 710, the first "no fault" detection bit line is connected by the plurality of symmetric pass gate circuits to the ground or reference voltage only when both corresponding word lines in adjacent memory banks are asserted. However, if only one of the corresponding word lines in adjacent memory banks are asserted, the word lines in the third switching circuit 710 control the plurality of symmetric pass gate circuits to connect the second "address fault" bit line to the ground or reference voltage.

In selected example embodiments, the third switching circuit 710 may include, for a first corresponding word line pair (e.g., WL0n and WL1n), a first symmetric pass gate circuit 711-712 and a second symmetric pass gate circuit 713-716. In addition, each of the remaining word line pairs of the memory banks (e.g., WL0m in Bank 0 and WL1m in Bank 1) are respectively connected to the gates of a first symmetric pass gate circuit (e.g., 717-718) and a second symmetric pass gate circuit (e.g., 719-722) as shown. The first symmetric pass gate circuit for a first corresponding word line pair (e.g., WL0n and WL1n) may be implemented with a series-connected pair of transistors (e.g., NMOS transistors 711-712) that is connected between a first "no fault" detection bit line (e.g., 724) and a reference voltage (e.g., ground). In the depicted configuration, the first symmetric pass gate circuit 711-712 is controlled by the corresponding word lines of adjacent memory banks (e.g., WL0n in Bank 0 and WL1n in Bank 1) which are connected to corresponding gates of the series-connected pair of transistors 711-712 to connect the first "no fault" detection bit line (e.g., 724) to the ground/reference only when both corresponding word lines are asserted. With the first "no fault" detection bit line (e.g., 724) connected between a word line enable transistor (e.g., PMOS transistor 728) and an inverter circuit (e.g., 726), the word line enable transistor (e.g., 728) precharges or pulls "UP" the first "no fault" detection bit line (e.g., 724) to a reference voltage (e.g., Vdd) in response to a common word line enable (wl_en) signal having a first or "LOW" logic level, but is otherwise turned "OFF" to float the first "no fault" detection bit line (e.g., 724) when the common word line enable (wl_en) signal has a second or "HIGH" logic level.

The second symmetric pass gate circuit for the first corresponding word line pair (e.g., WL0n and WL1n) may be implemented with a first series-connected pair of complementary transistors (e.g., NMOS transistor 713 and PMOS transistor 714) and a second series-connected pair of complementary transistors (e.g., PMOS transistor 715 and NMOS transistor 716), each of which is connected between a second "address fault" detection bit line (e.g., 723) and a reference voltage (e.g., ground). By connecting each word line (e.g., WL0n) to the gate of an NMOS transistor (e.g., 713) in one of the series-connected pair of complementary transistors (e.g., 713-714) and to the gate of a PMOS transistor (e.g., 715) in the other second series-connected pair of complementary transistors (e.g., 715-716), the second symmetric pass gate circuit is controlled by the corresponding word lines of adjacent memory banks (e.g., WL0n in Bank 0 and WL1n in Bank 1) to connect the second "address fault" detection bit line (e.g., 723) to the ground/reference only when one, but not both, of the corresponding word lines are asserted. With the second "address fault" detection bit line (e.g., 723) connected between a word line enable transistor (e.g., PMOS transistor 727) and an inverter circuit (e.g., 725), the word line enable transistor (e.g., 727) precharges or pulls "UP" the second "address fault" detection bit line (e.g., 723) to a reference voltage (e.g., Vdd) in response to a common word line enable (wl_en) signal having a first or "LOW" logic level, but is otherwise turned "OFF" to float the second "address fault" detection bit line (e.g., 723) when the common word line enable (wl_en) signal has a second or "HIGH" logic level. In selected embodiments, the second symmetric pass gate circuit may be constructed with small NMOS and PMOS transistor devices 713-716, 719-722 that are connected in series, provided they are sized sufficiently to discharge the second "address fault" detection bit line (e.g., 723).

During normal, error-free operation when a single pair of corresponding word lines (e.g., WL0n and WL1n) in adjacent banks (e.g., Bank 0 701 and Bank 1 703) are correctly asserted (as indicated by the thicker lines WL0n, WL1n), the first symmetric pass gate circuit (e.g., 711-712) in the third switching circuit (e.g., 710) will be activated by the correctly asserted word lines (e.g., WL0n and WLn) to pull the first "no fault" detection bit line (e.g., 724) to ground reference voltage across the activated transistor pair (e.g., 711-712), thereby generating a "no fault" signal (e.g., wl_ok_0) at the output of inverter (e.g., 726) having a first or "HIGH" logic value for the adjacent banks. At the same time, the second symmetric pass gate circuit (e.g., 713-716) is controlled to disconnect or leave floating the second "address fault" detection bit line (e.g., 723) since the correctly asserted word lines (e.g., WL0n and WL1n) deactivate the PMOS transistors 714, 715, thereby generating an "address fault" signal (e.g., wlfsl_0) at the output of inverter (e.g., 725) having a second or "LOW" logic value for the adjacent banks. Thus, normal error-free operation of the memory banks 701, 703 having correctly asserted word lines WL0n, WL1n will generate a "no fault" signal wl_ok_0="1" and an "address fault" signal wlfsl_0="0".

However, if there is a transient fault (e.g., a particle strike 707) which causes another word line (e.g., WL0m) in one of the adjacent memory banks (e.g., Bank 0 701) to falsely assert (as indicated by the thicker line WL0m), this will be detected in the third switching circuit 710 by the second symmetric pass gate circuit (e.g., 719-722) which is connected to the falsely asserted word line WL0m and the corresponding unasserted word line WL1m. In particular, the falsely asserted word line (e.g., WL0m) and the corresponding unasserted word line (e.g., WL1m) are connected, respectively, to the gates of the NMOS transistor 719 and PMOS transistor 720 so that the series-connected pair of complementary transistors (e.g., 719-720) are activated to pull the second "address fault" detection bit line (e.g., 723) to ground reference voltage, thereby generating an "address fault" signal (e.g., wlfsl_0) at the output of inverter (e.g., 725) having a first or "HIGH" logic value for the adjacent banks. At the same time, the first symmetric pass gate circuit (e.g., 717-718) is controlled to disconnect or leave floating the first "no fault" detection bit line (e.g., 724) since the correctly deasserted word line (e.g., WL1m) deactivates the NMOS transistor 718. As will be appreciated, the "false word line select fault" signal can be generated if one or more additional word lines in the first memory bank (e.g., Bank 0 701) are falsely asserted. In addition, the symmetric arrangement of the second symmetric pass gate circuit (e.g., 719-722) allows a false assertion of the word line WL1*m* and corresponding unasserted word line WL0*m* to be detected since they are connected, respectively, to the gates of the NMOS transistor 722 and PMOS transistor 721 so that the series-connected pair of complementary transistors (e.g., 721-722) are activated to pull the second "address fault" detection bit line (e.g., 723) to ground reference voltage, thereby generating an "address fault" signal (e.g., wlfsl_0) at the output of inverter (e.g., 725) having a first or "HIGH" logic value for the adjacent banks.

As seen from the foregoing, if there is no detected assertion of corresponding word line pairs in the adjacent memory banks 701, 703, the third switching circuit 710 will not pull the first "no fault" detection bit line 724 to ground reference voltage, thereby generating a "missing word line fault" signal (e.g., wl_ok_0) at the output of inverter (e.g., 726) having a first or "LOW" logic value. However, the correct, error-free assertion of corresponding word lines (e.g., WL0*n*, WL1*n*) in adjacent memory banks (e.g., 701, 703) will cause the third switching circuit 710 to pull the first "no fault" detection bit line 724 to ground reference voltage while leaving the second "address fault" detection bit line 725 floating or "high," thereby generating a "no fault" signal wl_ok_0="1" and an second "address fault" signal wlfsl_0="0". In addition, any additional falsely asserted word line(s) (e.g., WL0*m*) will cause the third switching circuit 710 to pull the second "address fault" detection bit line 723 to ground reference voltage, thereby generating an "address fault" signal (e.g., wlfsl_0) at the output of inverter (e.g., 725) having a second or "HIGH" logic value.

As shown in FIG. 7, the "no fault" signals wl_ok_0, wl_ok_1 generated from all of the adjacent pairings of memory banks may be connected as inputs to a first shared combinatorial logic circuit 729 (e.g., AND gate). In addition, the "address fault" signals wlfsl_0, wlfsl_1 generated from all of the adjacent pairings of memory banks may be connected as inputs to a second shared combinatorial logic circuit 730 (e.g., OR gate). In this configuration, the resulting outputs wl_ok, wl_fs1 from the first and second shared combinatorial logic circuits 729, 730 will indicate the presence of transient address faults. In particular, if all of the "no fault" signals wl_ok_0, wl_ok_1 have a first or "HIGH" logic value and all of the "address fault" signals wlfsl_0, wlfsl_1 have a second or "LOW" logic value, there is no address fault detected as indicated by the "HIGH" AND-gate output wl_ok from the first shared combinatorial logic circuit 729 and the "LOW" OR-gate output wl_fs1 from the second shared combinatorial logic circuit 730. However, if all of the "no fault" signals wl_ok_0, wl_ok_1 have a first or "HIGH" logic value and any of the "address fault" signals wlfsl_0, wlfsl_1 has a first or "HIGH" logic value, a "multiple word line selection" fault is indicated by the "HIGH" AND-gate output wl_ok from the first shared combinatorial logic circuit 729 and the "HIGH" OR-gate output wl_fs1 from the second shared combinatorial logic circuit 730. In addition, if any of the "no fault" signals wl_ok_0, wl_ok_1 has a second or "LOW" logic value, a "missing word line selection" fault is indicated by the "LOW" AND-gate output wl_ok from the first shared combinatorial logic circuit 729 and the "LOW" OR-gate output wl_fs1 from the second shared combinatorial logic circuit 730. Finally, if any of the "address fault" signals wlfsl_0, wlfsl_1 has a first or "HIGH" logic value, a "false word line selection" fault is indicated by the "HIGH" OR-gate output wl_fs1 from the second shared combinatorial logic circuit 730.

The functionality of the third switching circuit 710 follows from the fact that multiple word line selection faults are mainly caused by a common gate upset shared by physically adjacent word line drivers, so there is a very low or negligible likelihood that one or two alpha particle hits in two word line drivers in different banks of the same bits. Instead, the third switching circuit 710 is configured to detect the presence of at least one false word line selection (e.g., WL0*m*) in addition to the correctly selected word lines (e.g., WL0*n*, WL1*n*).

As will be appreciated, other switching circuit connections can be used between adjacent memory banks to provide symmetric detection of multiple word line selection faults. To illustrate additional embodiments of the fault detection bit line circuit disclosed herein for detecting multiple word line selection faults, reference is now made to FIG. 8 which shows a simplified schematic block diagram of a multi-bank memory system 800 with a plurality of memory banks 801, 803, each having an identical SRAM design and structure with adjacent word line decoder and driver blocks 802, 804 controlled by corresponding address latches 805, 806 which are separately controlled by different address codes to provide word line selection. To connect corresponding word line segments (e.g., WL0*n*, WL1*n*) in different banks (e.g., 801, 803) a fourth switching circuit 810 is connected therebetween to detect different word line fault conditions. The depicted fourth switching circuit 810 includes a plurality of symmetric pass gate circuits connected to each pair of word lines to control the connection of a first "no fault" detection bit line and a second "address fault" bit line to a reference voltage (e.g., ground), depending on the assertion status of the corresponding word lines. In particular, the first "no fault" detection bit line (e.g., 824) is connected to the ground or reference voltage by the plurality of symmetric pass gate circuits in the fourth switching circuit 810 only when both corresponding word lines in adjacent memory banks are asserted. But if only one of the corresponding word lines in adjacent memory banks are asserted, the word lines in the fourth switching circuit 810 control the plurality of symmetric pass gate circuits to connect the second "address fault" bit line (e.g., 823) to the ground or reference voltage.

In selected example embodiments, the fourth switching circuit 810 may include, for a first corresponding word line pair (e.g., WL0*n* and WL1*n*), a first symmetric pass gate circuit 811-812, a second symmetric pass gate circuit 814-815, and first and second connection transistors 813, 816. Between first and second shared nodes, the second symmetric pass gate circuit 814-815 is connected in parallel with the first symmetric pass gate circuit 811-812. In addition, the first and second connection transistors 813, 816, respectively connect the first and second shared nodes to a reference voltage (e.g., ground) as shown. For the remaining word line pairs of the memory banks (e.g., WL0*m* in Bank 0 and WL1*m* in Bank 1), a similar arrangement of a first symmetric pass gate circuit 817-818, second symmetric pass gate circuit 820-821, and first and second connection transistors 819, 822 is provided. In the depicted configuration for the first corresponding word line pair (e.g., WL0*n* and WL1*n*), the first symmetric pass gate circuit 811-812 and connection transistors 813, 816 are controlled by the corresponding word lines of adjacent memory banks (e.g., WL0*n* in Bank 0 and WL1*n* in Bank 1) to connect the first "no fault" detection bit line (e.g., 824) to the ground/reference only when both corresponding word lines are asserted. In addition, the second symmetric pass gate circuit 814-815 and connection transistors 813, 816 are controlled by the corresponding word lines of adjacent memory banks (e.g., WL0*n* in Bank 0 and WL*n* in Bank 1) to connect the second "address fault" detection bit line (e.g., 823) to the ground/reference only if one, but not both, of the corresponding word lines are asserted.

In selected embodiments, the first symmetric pass gate circuit for a first corresponding word line pair (e.g., WL0n and WLn) may be implemented with a first cross-coupled pair of series-connected transistors (e.g., NMOS transistors 811-812) which is connected in parallel with a second symmetric pass gate circuit that is implemented with a second cross-coupled pair of series-connected transistors (e.g., PMOS transistors 814-815). The first cross-coupled pair of series-connected NMOS transistors 811-812 is connected at a shared node to a first "no fault" detection bit line (e.g., 824), while the second cross-coupled pair of series-connected PMOS transistors 814-815 is connected at a shared node to a second "address fault" detection bit line (e.g., 823). As illustrated, the first "no fault" detection bit line (e.g., 824) and second "address fault" detection bit line (e.g., 823) are simultaneously precharged or pulled "UP" to a reference voltage (e.g., Vdd) across word line enable transistors (e.g., PMOS transistor 827, 828) in response to a common word line enable (wl_en) signal as described hereinabove. In addition, each detection bit line 823, 824 is connected to an output inverter 825, 826 for generating, respectively, an "address fault" signal (e.g., wlfsl_0) and an "no fault" signal (e.g., wl_ok_0).

To control the fourth switching circuit 810, the first word line WL0n is connected to the gates of transistors 812 and 815 in the first and second first symmetric pass gate circuits and to the gate of first connection transistor 813, while the second word line WL1n is connected to the gates of transistors 811 and 814 in the first and second first symmetric pass gate circuits and to the gate of second connection transistor 816 as shown. In similar fashion, each of the remaining word line pairs of the memory banks (e.g., WL0m in Bank 0 and WL1m in Bank 1) are respectively connected to the gates of a first symmetric pass gate circuit (e.g., 817-818), second symmetric pass gate circuit (e.g., 820-821), and connection transistors (e.g., 819, 822) as shown. On one side of the fourth switching circuit 810, a first connection transistor 813 connects a first shared node of the first and second symmetric pass gate circuits to ground under control of a first word line (e.g., WL0n) connected to the gate of the first connection transistor 813. Similarly, a second connection transistor 816 on the other side of the fourth switching circuit 810 connects a second shared node of the first and second symmetric pass gate circuits to ground under control of a corresponding second word line (e.g., WL1n) connected to the gate of the second connection transistor 816.

With the first word line WL0n connected to the gates of NMOS transistors 812-813 and PMOS transistor 815 and the second word line WL1n connected to the gates of NMOS transistors 811, 816 and PMOS transistor 814, the first symmetric pass gate circuit 811-812 and first and second connection transistors 813, 816 are controlled by the corresponding word lines of adjacent memory banks (e.g., WL0n in Bank 0 and WL1n in Bank 1) to connect the first "no fault" detection bit line (e.g., 824) to the ground/reference only when both corresponding word lines are asserted.

However, if there is a transient fault (e.g., a particle strike 807), this may cause another word line (e.g., WL0m) in one of the adjacent memory banks (e.g., Bank 0 801) to falsely assert (as indicated by the thicker line WL0m) while the corresponding word line (e.g., WL1m) in the adjacent memory bank (e.g., Bank 1 803) remains unasserted. In this case, the false assertion of word line WL0m will be detected in the fourth switching circuit 810 by the second symmetric pass gate circuit (e.g., 820-821) and associated connection transistors 819, 822 which are connected to the falsely asserted word line WL0m and the corresponding unasserted word line WL m. In particular, the falsely asserted word line (e.g., WL0m) and the corresponding unasserted word line (e.g., WL1m) are connected, respectively, to the gates of the NMOS connection transistor 819 and PMOS transistor 820 so that the series-connected pair of complementary transistors (e.g., 819-820) are activated to pull the second "address fault" detection bit line (e.g., 823) to ground reference voltage, thereby generating an "address fault" signal (e.g., wlfsl_0) at the output of inverter (e.g., 825) having a first or "HIGH" logic value for the adjacent banks. At the same time, the first symmetric pass gate circuit (e.g., 817-818) is controlled to disconnect or leave floating the first "no fault" detection bit line (e.g., 824) since the correctly deasserted word line (e.g., WL1m) deactivates the NMOS transistor 817. As will be appreciated, the "false word line select fault" signal can be generated if one or more additional word lines in the first memory bank (e.g., Bank 0 801) are falsely asserted. In addition, the symmetric arrangement of the second symmetric pass gate circuit (e.g., 820-821) and associated connection transistors (e.g., 819, 822) allows a false assertion of the word line WL1m and corresponding unasserted word line WL0m to be detected since they are connected, respectively, to the gates of the NMOS transistor 822 and PMOS transistor 821 so that the series-connected pair of complementary transistors (e.g., 821-822) are activated to pull the second "address fault" detection bit line (e.g., 823) to ground reference voltage, thereby generating an "address fault" signal (e.g., wlfsl_0) at the output of inverter (e.g., 825) having a first or "HIGH" logic value for the adjacent banks.

Figure 8:
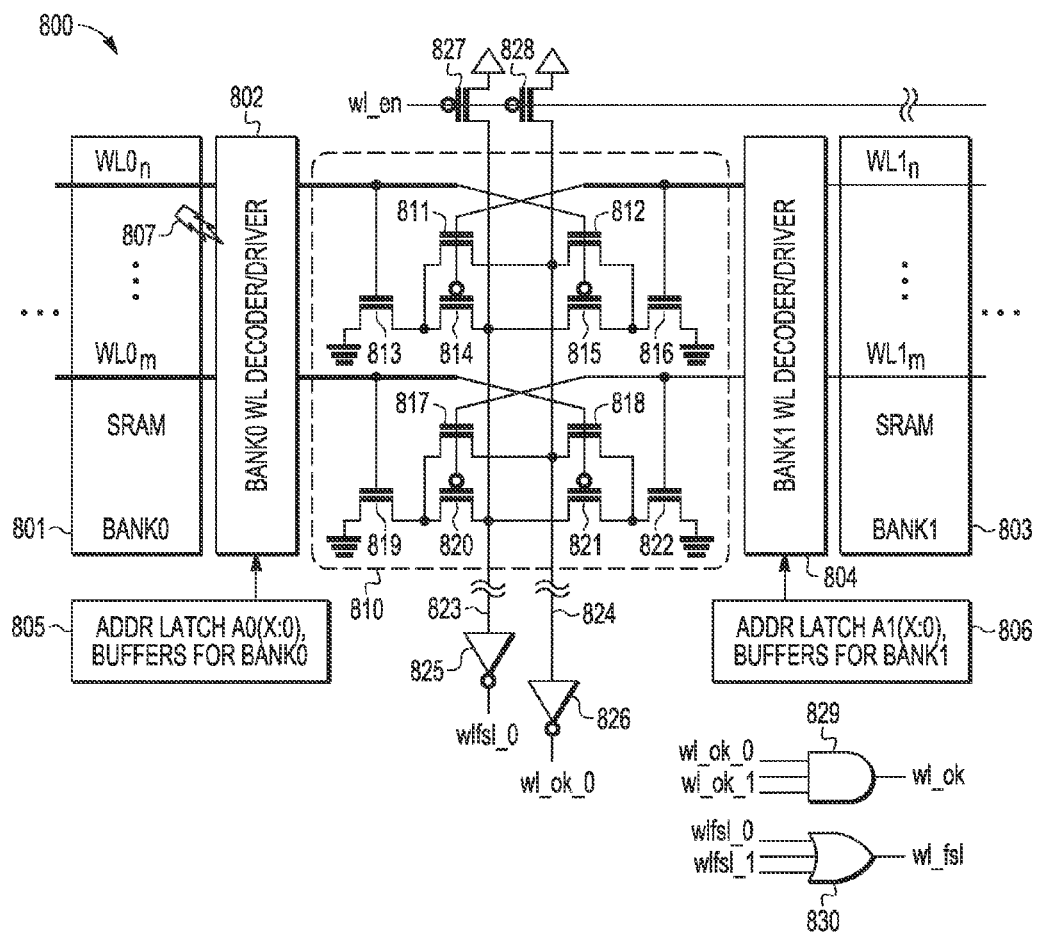
FIG. 8 shows a simplified block diagram of a multi-bank memory system having word line decoder and driver circuits in adjacent banks connected across a plurality of fourth switching circuits which connect word lines of adjacent banks to detect different word line fault conditions in accordance with selected embodiments of the present disclosure.

As shown in FIG. 8, the "no fault" signals wl_ok_0, wl_ok_1 generated from all of the adjacent pairings of memory banks may be connected as inputs to a first shared combinatorial logic circuit 829 (e.g., AND gate), while the "address fault" signals wlfsl_0, wlfsl_1 generated from all of the adjacent pairings of memory banks may be connected as inputs to a second shared combinatorial logic circuit 830 (e.g., OR gate). In this configuration, the resulting outputs wl_ok, wl_fs1 from the first and second shared combinatorial logic circuits 829, 830 will indicate the presence of transient address faults. In particular, if all of the "no fault" signals wl_ok_0, wl_ok_1 have a first or "HIGH" logic value and all of the "address fault" signals wlfsl_0, wlfsl_1 have a second or "LOW" logic value, there is no address fault detected as indicated by the "HIGH" AND-gate output wl_ok from the first shared combinatorial logic circuit 829 and the "LOW" OR-gate output wl_fs1 from the second shared combinatorial logic circuit 830. However, if all of the "no fault" signals wl_ok_0, wl_ok_1 have a first or "HIGH" logic value and any of the "address fault" signals wlfsl_0, wlfsl_1 has a first or "HIGH" logic value, a "multiple word line selection" fault is indicated by the "HIGH" AND-gate output wl_ok from the first shared combinatorial logic circuit 829 and the "HIGH" OR-gate output wl_fs1 from the second shared combinatorial logic circuit 830. In addition, if any of the "no fault" signals wl_ok_0, wl_ok_1 has a second or "LOW" logic value, a "missing word line selection" fault is indicated by the "LOW" AND-gate output wl_ok from the first shared combinatorial logic circuit 829 and the "LOW" OR-gate output wl_fs1 from the second shared combinatorial logic circuit 830. Finally, if any of the "address fault" signals wlfsl_0, wlfsl_1 has a first or "HIGH" logic value, a "false word line selection" fault is indicated by the "HIGH" OR-gate output wl_fs1 from the second shared combinatorial logic circuit 830.

By now it should be appreciated that there is provided herein a method and apparatus for detecting transient address faults in a semiconductor memory device having a memory array with a first memory bank (e.g., a first SRAM memory bank) with a first plurality of word lines, and a second memory bank (e.g., a second SRAM memory bank) with a second plurality of word lines. The disclosed semiconductor memory devices includes an address fault detector circuit connected to one of the first and second plurality of word lines, where the address fault detector circuit includes a plurality of first MOSFET transistors connected respectively to each of the first and second plurality of word lines for detecting an error-free operation mode at the first and second memory banks and for detecting a plurality of different transient address faults including a "no word line select," "false word line select," and "multiple word line select" failure mode at one of the first and second memory banks. In selected embodiments, the address fault detector circuit includes a plurality of resistive elements, each of which is connected between a word line from the first plurality of word lines and a corresponding word line from the second plurality of word lines. In addition, the plurality of first MOSFET transistors are arranged in a row in the first memory bank, each first MOSFET transistor including a gate coupled to a corresponding one of the first plurality of word lines, a source connected to a first reference voltage, and a drain connected to a first shared fault detection bit line for the first memory bank. In such embodiments, the first shared fault detection bit line may be coupled across a precharge transistor to a second, higher reference voltage in response to a precharge signal having a first logic state, and may be disconnected from the second reference voltage by the precharge transistor in response to the precharge signal having a second logic state. In this configuration, a voltage level of the first shared fault detection bit line is discharged from the second reference voltage towards the first reference voltage with a first time rate greater than a first time constant if the address fault detector circuit detects a "no word line select" or "false word line select" failure mode. Alternatively, the first shared fault detection bit line is discharged with a second time rate less than a second, different time constant that is smaller than the first time constant if the address fault detector circuit detects a "multiple word line select" failure mode. Alternatively, the first shared fault detection bit line is discharged with a third time rate between the first and second time constants if the address fault detector circuit detects the error-free operation mode at the first and second memory banks. In yet other embodiments, the voltage level of the first shared fault detection bit line is discharged from the second reference voltage towards the first reference voltage with a first time constant if the address fault detector circuit detects the error-free operation mode at the first and second memory banks, is discharged with a second time constant if the address fault detector circuit detects a "no word line select" or "false word line select" failure mode at one of the first and second memory banks, and is discharged with a third time constant if the address fault detector circuit detects a "multiple word line select" failure mode at one of the first and second memory banks, wherein the first time constant is less than the second time constant and greater than the third time constant. In selected example embodiments under specified process technology, voltage, and temperature conditions, a typical range for the first time constant can be 10 ps/mv to 1 ns/mv, meaning it requires at least 10 picoseconds to cause one millivolt change on the first shared fault detection bit line, and a typical range for the second time constant can be from 0.1 ps/mv to 1 ps/mv. In selected embodiments, the address fault detector circuit may include first and second trip point inverters having inputs connected to the first shared fault detection bit line to respectively generate first and second inverter output signals which are asserted only when the first or second trip point inverter input exceeds a trigger voltage, where the first trip point inverter is triggered by a first relatively high trigger voltage and the second trip point inverter is triggered by a second relatively low trigger voltage. In addition, detection logic is configured to detect the error-free operation mode at the first memory bank when the first inverter output signal is asserted and the second inverter output signal is not asserted. In addition, the detection logic may be configured to detect the "multiple word line select" failure mode at the first memory bank when the first and second inverter output signals are both asserted. In addition, the detection logic may be configured to detect the "false word line select" failure mode at the first memory bank when the first inverter output signal is not asserted and the second inverter output signal is not asserted. In addition, the detection logic may be configured to detect the "no word line select" failure mode at the first memory bank when the first inverter output signal is not asserted and the second inverter output signal is not asserted. In operation, the address fault detector circuit may discharge a voltage at the first shared fault detection bit line with a time rate faster than a first time constant and slower than a second time constant upon detecting the error-free operation mode at one of the first and second memory banks, where the first time constant is greater than the second time constant. Alternatively, the address fault detector circuit may discharge a voltage at the first shared fault detection bit line with a time rate faster than a first time constant and a second, smaller time constant upon detecting the "multiple word line select" failure mode at one of the first and second memory banks. Alternatively, the address fault detector circuit may discharge a voltage at the first shared fault detection bit line with a time rate slower than a first time constant upon detecting one of the "no word line select" and "false word line select" failure modes at one of the first and second memory banks.

In other embodiments, the address fault detector circuit may include a plurality of pass gate circuits, each pass gate circuit controlled by corresponding pair of word lines from the first and second plurality of word lines to connect a first shared fault detection bit line to a first reference voltage only when both of the corresponding pair of word lines are asserted. In such embodiments, the address fault detector circuit may also include a first inverter having an input connected to the first shared fault detection bit line to generate a first inverter output signal which is asserted only when there is at least one corresponding pair of word lines asserted in the first and second memory banks indicating the error-free operation mode, and which is not otherwise asserted indicating the "no word line select" failure mode at one of the first and second memory banks. In selected embodiments, each pass gate circuit includes first and second of NFET transistors connected in series between the first shared fault detection bit line and the first reference voltage, with one of the corresponding pair of word lines from the first plurality of word lines connected to a gate of the first NFET transistor and with the other of the corresponding pair of word lines from the second plurality of word lines connected to a gate of the second NFET transistor. In other embodiments, each pass gate circuit also includes third and fourth of NFET transistors connected in series between the first shared fault detection bit line and the first reference voltage, with one of the corresponding pair of word lines from the first plurality of word lines connected to a gate of the third NFET transistor and with the other of the corresponding pair of word lines from the second plurality of word lines connected to a gate of the fourth NFET transistor. In yet other embodiments, each pass gate circuit may also include fifth and sixth NFET transistors connected in series between a second shared fault detection bit line and the first reference voltage; seventh and eighth NFET transistors connected in series between the second shared fault detection bit line and the first reference voltage; and a second inverter having an input connected to the second shared fault detection bit line to generate a second inverter output signal which is asserted only when there is at least one corresponding pair of word lines in which one, but not both, word lines are asserted in the first and second memory banks indicating the "false word line select" and/or "multiple word line select" failure mode at one of the first and second memory banks.

In other embodiments, there is disclosed a method and apparatus for detecting transient address faults. In the disclosed methodology, a semiconductor memory device is provided that includes a word line decoder coupled to a plurality of split word lines formed across first and second memory banks. In addition, an address signal is applied to the word line decoder so as to activate a corresponding one of the split word lines formed across the first and second memory bank banks. Finally, the plurality of split word lines are monitored with an address fault detector circuit having a plurality of first MOSFET transistors connected respectively between each of the plurality of split word lines and a shared fault detection bit line formed in the first memory bank as a single ROM column to detect an error-free operation mode, a transient "no word line select" failure mode, a transient "false word line select" failure mode, and a transient "multiple word line select" failure mode at one of the first and second memory banks. In selected embodiments, the semiconductor device is provided by connecting a plurality of resistive elements between the first and second memory banks, each resistive element connected between a first portion of a split word line in the first memory bank and a corresponding second portion of the split word line in the second memory bank, where each of the plurality of first MOSFET transistors include a gate coupled to a corresponding one of the first plurality of split word lines, a source connected to a first reference voltage, and a drain connected to the first shared fault detection bit line for the first memory bank. In other embodiments, the semiconductor device is provided by connecting a plurality of pass gate circuits between the first and second memory banks, each pass gate circuit connected between a first portion of a split word line in the first memory bank and a corresponding second portion of the split word line in the second memory bank so as to connect the shared fault detection bit line to a reference voltage only when the first and second portions of the split word line are correctly asserted to indicate the error-free operation mode for the first and second memory banks.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified circuit schematic and block diagram drawings illustrating design and operational details of different multi-bank memory systems without including every circuit detail in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. Some portions of the detailed descriptions provided herein are also presented in terms of logic, algorithms and instructions that operate on data that is stored in a computer memory. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of hardware or a computer system or a similar electronic computing device, that manipulates and transforms data represented as physical (electronic) quantities within registers and memories into other data similarly represented as physical quantities within the memories or registers or other such information storage, transmission or display devices. In addition, although example resistor and switched word line connection circuits are described herein for connecting word lines from different banks, those skilled in the art will recognize that other word line connection circuits can be substituted without loss of function. Such details are well known and not considered necessary to teach one skilled in the art of how to make or use the present invention.

Although the described exemplary embodiments disclosed herein are directed to various memory system circuits and methods for detecting transient address faults, the present invention is not necessarily limited to the example embodiments which illustrate inventive aspects of the present invention that are applicable to a wide variety of memory systems. For example, different types of memory systems (e.g., SRAM, DRAM) having one or more memory banks can use any desired word line connection and detection arrangement to quickly and efficiently detect transient address faults at the word line driver and decoder. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising." or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor memory device comprising:
    a memory array comprising:
        a first memory bank with a first plurality of word lines, and
        a second memory bank with a second plurality of word lines; and
    an address fault detector circuit connected to one of the first and second plurality of word lines and comprising a plurality of first MOSFET transistors connected respectively to each of the first and second plurality of word lines for detecting an error-free operation mode at the first and second memory banks and for detecting a plurality of different transient address faults including a "no word line select," "false word line select," and "multiple word line select" failure mode at one of the first and second memory banks.

2. The semiconductor memory device of claim 1, where the first and second memory banks each comprise an SRAM memory bank.

3. The semiconductor memory device of claim 1, where the address fault detector circuit comprises:
    a plurality of resistive elements, each resistive element connected between each word line from the first plurality of word lines and a corresponding word line from the second plurality of word lines;
    where the plurality of first MOSFET transistors are arranged in a row in the first memory bank, each first MOSFET transistor comprising a gate coupled to a corresponding one of the first plurality of word lines, a source connected to a first reference voltage, and a drain connected to a first shared fault detection bit line for the first memory bank.

4. The semiconductor memory device of claim 3, wherein the address fault detector circuit discharges a voltage at the first shared fault detection bit line with a time rate faster than a first time constant and slower than a second time constant upon detecting the error-free operation mode at one of the first and second memory banks, where the first time constant is greater than the second time constant.

5. The semiconductor memory device of claim 3, wherein the address fault detector circuit discharges a voltage at the first shared fault detection bit line with a time rate faster than a first time constant and a second, smaller time constant upon detecting the "multiple word line select" failure mode at one of the first memory and second banks.

6. The semiconductor memory device of claim 3, wherein the address fault detector circuit discharges a voltage at the first shared fault detection bit line with a time rate slower than a first time constant upon detecting one of the "no word line select" and "false word line select" failure mode at one of the first and second memory banks.

7. The semiconductor memory device of claim 3, where the first shared fault detection bit line is coupled across a precharge transistor to a second reference voltage in response to a precharge signal having a first logic state, and is disconnected from the second reference voltage by the precharge transistor in response to the precharge signal having a second logic state, wherein the second reference voltage is higher than the first reference voltage.

8. The semiconductor memory device of claim 7, where a voltage level of the first shared fault detection bit line is discharged from the second reference voltage towards the first reference voltage with a first time rate greater than a first time constant if the address fault detector circuit detects the "no word line select" or "false word line select" failure mode, with a second time rate less than a second, different time constant if the address fault detector circuit detects the "multiple word line select" failure mode, and with a third time rate between the first and second time constants if the address fault detector circuit detects the error-free operation mode at the first and second memory banks, wherein the first time constant is greater than the second time constant.

9. The semiconductor memory device of claim 7, where a voltage level of the first shared fault detection bit line is discharged from the second reference voltage towards the first reference voltage with a first time constant if the address fault detector circuit detects the error-free operation mode at the first and second memory banks, where the first shared fault detection bit line is discharged with a second time constant if the address fault detector circuit detects the "no word line select" or "false word line select" failure mode at one of the first and second memory banks, and where the first shared fault detection bit line is discharged with a third time constant if the address fault detector circuit detects the "multiple word line select" failure mode at one of the first and second memory banks, wherein the first time constant is less than the second time constant and greater than the third time constant.

10. The semiconductor memory device of claim 3, further comprising first and second trip point inverters having inputs connected to the first shared fault detection bit line to respectively generate first and second inverter output signals which are asserted only when the first or second trip point inverter input exceeds a trigger voltage, where the first trip point inverter is triggered by a first relatively high trigger voltage and the second trip point inverter is triggered by a second relatively low trigger voltage.

11. The semiconductor memory device of claim 10, further comprising detection logic that configured to detect the error-free operation mode at the first memory bank when the first inverter output signal is asserted and the second inverter output signal is not asserted.

12. The semiconductor memory device of claim 10, further comprising detection logic that configured to detect the "multiple word line select" failure mode at the first memory bank when the first and second inverter output signals are both asserted.

13. The semiconductor memory device of claim 10, further comprising detection logic that configured to detect the "false word line select" failure mode at the first memory bank when the first inverter output signal is not asserted and the second inverter output signal is not asserted.

14. The semiconductor memory device of claim 10, further comprising detection logic that configured to detect the "no word line select" failure mode at the first memory bank when the first inverter output signal is not asserted and the second inverter output signal is not asserted.

15. The semiconductor memory device of claim 1, where the address fault detector circuit comprises:
   a plurality of pass gate circuits, each pass gate circuit controlled by corresponding pair of word lines from the first and second plurality of word lines to connect a first shared fault detection bit line to a first reference voltage only when both of the corresponding pair of word lines are asserted; and
   a first inverter having an input connected to the first shared fault detection bit line to generate a first inverter output signal which is asserted only when there is at least one corresponding pair of word lines asserted in the first and second memory banks indicating the error-free operation mode, and which is not otherwise asserted indicating the "no word line select" failure mode at one of the first and second memory banks.

16. The semiconductor memory device of claim 15, where each pass gate circuit comprises first and second of NFET transistors connected in series between the first shared fault detection bit line and the first reference voltage, with one of the corresponding pair of word lines from the first plurality of word lines connected to a gate of the first NFET transistor and with the other of the corresponding pair of word lines from the second plurality of word lines connected to a gate of the second NFET transistor.

17. The semiconductor memory device of claim 16, where each pass gate circuit further comprises third and fourth of NFET transistors connected in series between the first shared fault detection bit line and the first reference voltage, with one of the corresponding pair of word lines from the first plurality of word lines connected to a gate of the third NFET transistor and with the other of the corresponding pair of word lines from the second plurality of word lines connected to a gate of the fourth NFET transistor.

18. The semiconductor memory device of claim 16, where each pass gate circuit further comprises:
   fifth and sixth NFET transistors connected in series between a second shared fault detection bit line and the first reference voltage;
   seventh and eighth NFET transistors connected in series between the second shared fault detection bit line and the first reference voltage; and
   a second inverter having an input connected to the second shared fault detection bit line to generate a second inverter output signal which is asserted only when there is at least one corresponding pair of word lines in which one, but not both, word lines are asserted in the first and second memory banks indicating the "false word line select" and/or "multiple word line select" failure mode at one of the first and second memory banks.

19. A method for detecting transient address faults, comprising:
   providing in a semiconductor memory device comprising a word line decoder coupled to a plurality of split word lines formed across first and second memory banks;
   applying an address signal to the word line decoder so as to activate a corresponding one of the split word lines formed across the first and second memory banks;
   monitoring the plurality of split word lines with an address fault detector circuit comprising a plurality of first MOSFET transistors connected respectively between each of the plurality of split word lines and a shared fault detection bit line formed in the first memory bank as a single ROM column to detect an error-free operation mode, a transient "no word line select" failure mode, a transient "false word line select" failure mode, and a transient "multiple word line select" failure mode at one of the first and second memory banks.

20. The method of claim 19, where providing the semiconductor device comprises connecting a plurality of resistive elements between the first and second memory banks, each resistive element connected between a first portion of a split word line in the first memory bank and a corresponding second portion of the split word line in the second memory bank, where each of the plurality of first MOSFET transistors include a gate coupled to a corresponding one of the first plurality of split word lines, a source connected to a first reference voltage, and a drain connected to the first shared fault detection bit line for the first memory bank.

21. The method of claim 19, where providing the semiconductor device comprises connecting a plurality of pass gate circuits between the first and second memory banks, each pass gate circuit connected between a first portion of a split word line in the first memory bank and a corresponding second portion of the split word line in the second memory bank so as to connect the shared fault detection bit line to a reference voltage only when the first and second portions of the split word line are correctly asserted to indicate the error-free operation mode for the first and second memory banks.

* * * * *